(12) United States Patent
Tada et al.

(10) Patent No.: US 10,064,252 B2
(45) Date of Patent: Aug. 28, 2018

(54) ORGANIC EL DISPLAY UNIT, METHOD OF MANUFACTURING THE SAME, AND ELECTRONIC APPARATUS

(71) Applicant: Sony Corporation, Tokyo (JP)

(72) Inventors: Keishi Tada, Kanagawa (JP); Jiro Yamada, Kanagawa (JP); Shinichiro Morikawa, Kanagawa (JP); Masaaki Sekine, Kanagawa (JP); Naoki Matsushita, Kanagawa (JP); Kohji Hanawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/512,137

(22) PCT Filed: Sep. 14, 2015

(86) PCT No.: PCT/JP2015/075958
§ 371 (c)(1),
(2) Date: Mar. 17, 2017

(87) PCT Pub. No.: WO2016/052151
PCT Pub. Date: Apr. 7, 2016

(65) Prior Publication Data
US 2017/0280531 A1      Sep. 28, 2017

(30) Foreign Application Priority Data

Sep. 30, 2014   (JP) ................................. 2014-201517

(51) Int. Cl.
*H05B 33/22*       (2006.01)
*H01L 27/32*       (2006.01)
*H01L 51/52*       (2006.01)

(52) U.S. Cl.
CPC .......... *H05B 33/22* (2013.01); *H01L 27/3206* (2013.01); *H01L 51/5256* (2013.01); *H01L 27/3209* (2013.01); *H01L 27/3244* (2013.01)

(58) Field of Classification Search
CPC ....... H01L 33/62; H01L 33/486; H01L 33/54; H01L 33/56; H01L 27/3251
See application file for complete search history.

(56) References Cited

U.S. PATENT DOCUMENTS 9,112,181 B2 *   8/2015   Yamae ................... H05B 33/04
9,406,698 B2 *   8/2016   Yamazaki ........... H01L 27/1214
2014/0065430 A1  3/2014   Yamazaki et al.

FOREIGN PATENT DOCUMENTS

CN       103681756 A     3/2014
JP       01-187795 A     7/1989
(Continued)

OTHER PUBLICATIONS

Chinese Office Action dated May 4, 2018 for corresponding Chinese Application No. 2015800511315.

*Primary Examiner* — Quoc Hoang
(74) *Attorney, Agent, or Firm* — Michael Best & Friedrich LLP

(57) ABSTRACT

An organic EL display unit includes a first substrate, a second substrate, a display layer, and a sealing section. The display layer is provided between the first substrate and the second substrate. The display layer includes an organic layer. The sealing section is provided continuously from an end surface of the display layer to at least a portion of respective end surfaces of the first substrate and the second substrate.

19 Claims, 13 Drawing Sheets

(56) References Cited

FOREIGN PATENT DOCUMENTS

| | | |
|---|---|---|
| JP | 2002-324666 A | 11/2002 |
| JP | 2003-282241 A | 10/2003 |
| JP | 2007-200801 A | 8/2007 |
| JP | 2009-117079 A | 5/2009 |
| JP | 2009-545113 A | 12/2009 |
| JP | 2010-067350 A | 3/2010 |
| JP | 2012-513665 A | 6/2012 |
| JP | 2013-186984 A | 9/2013 |
| JP | 2014-022158 A | 2/2014 |
| JP | 2014-191011 A | 10/2014 |
| JP | 2015-141749 A | 8/2015 |
| WO | 2006/088185 A1 | 8/2006 |

* cited by examiner

[FIG. 1]
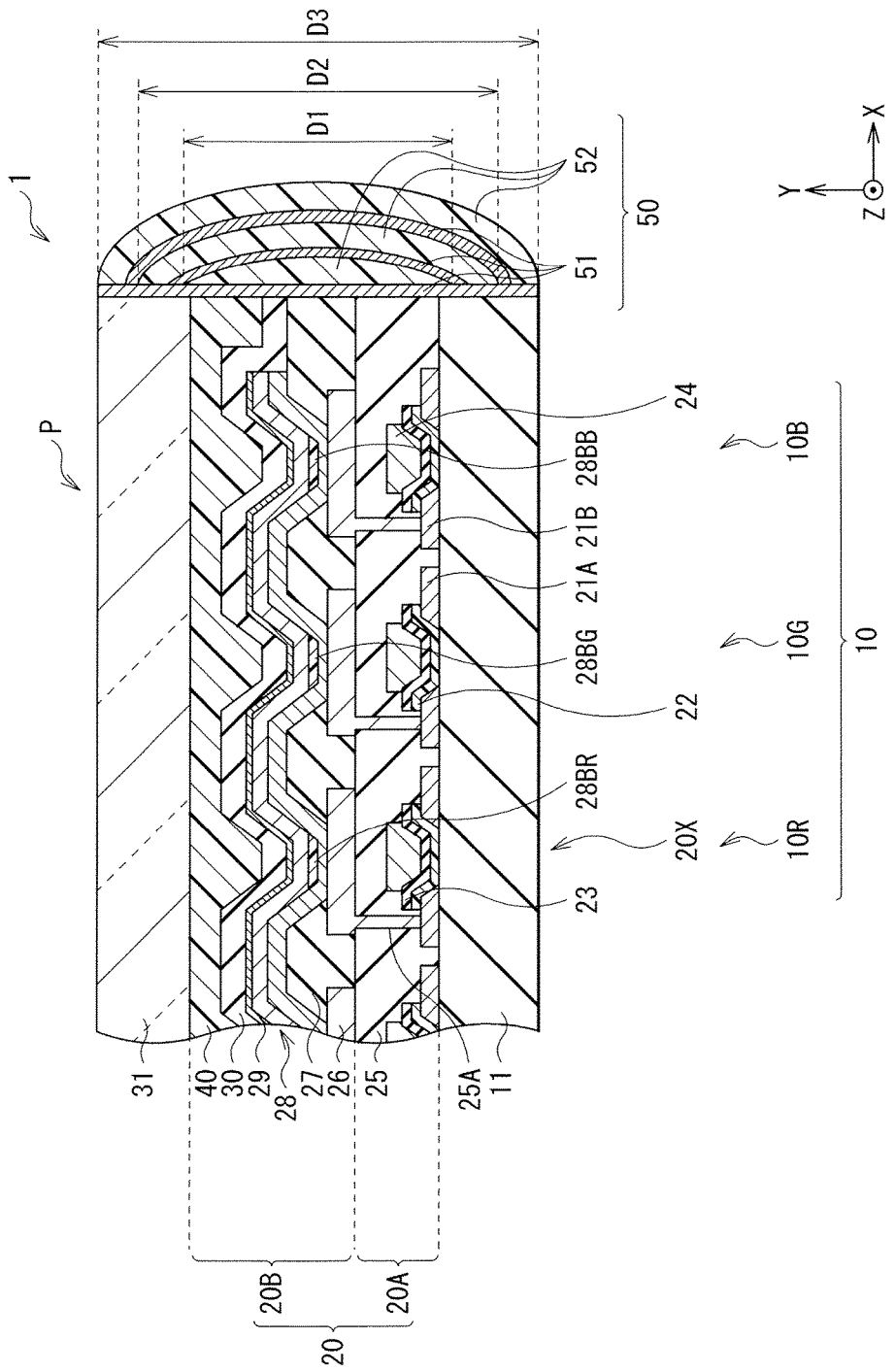

[ FIG. 2 ]
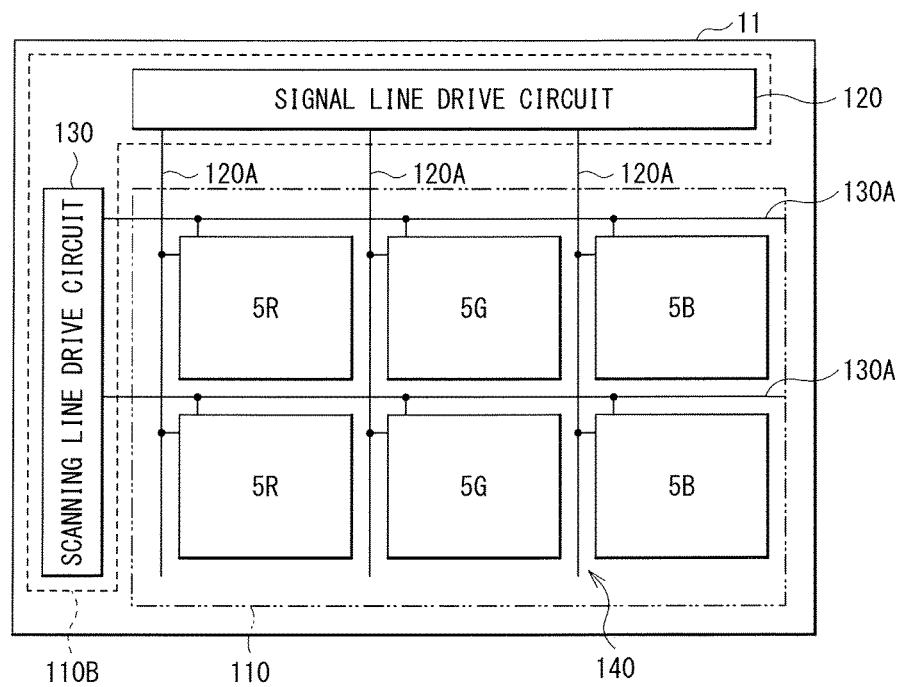
[ FIG. 3 ]
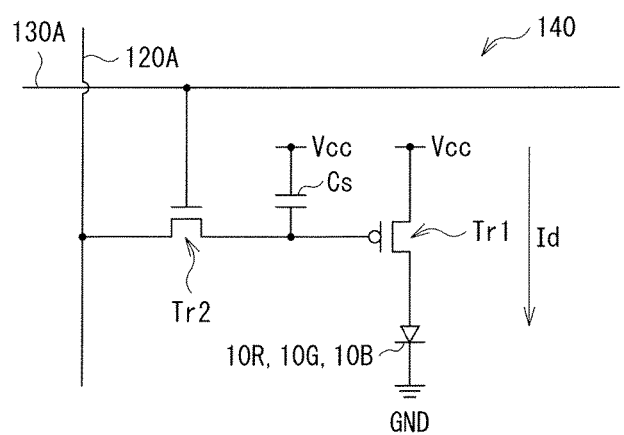

[ FIG. 4 ]
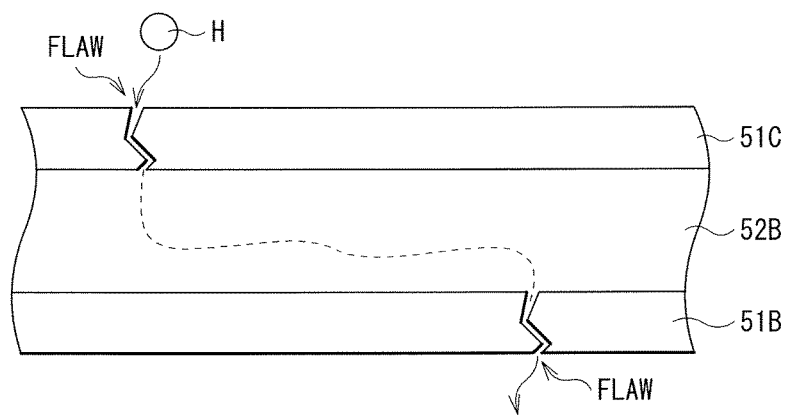
[ FIG. 5 ]
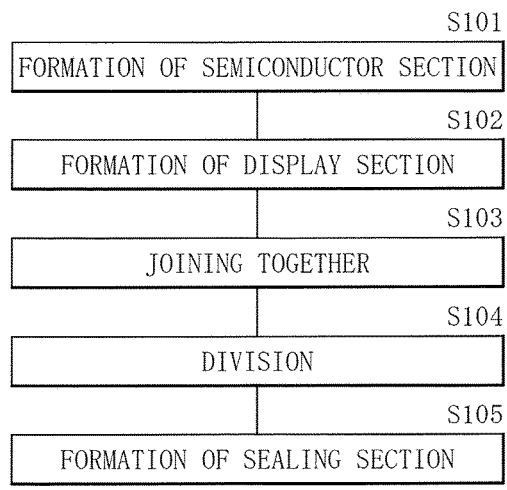

[ FIG. 6A ]
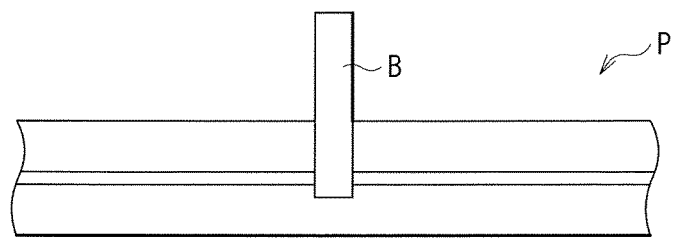
[ FIG. 6B ]
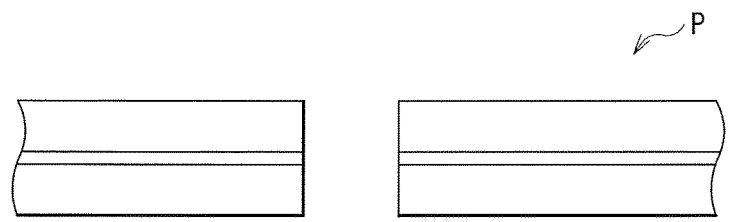
[ FIG. 7 ]
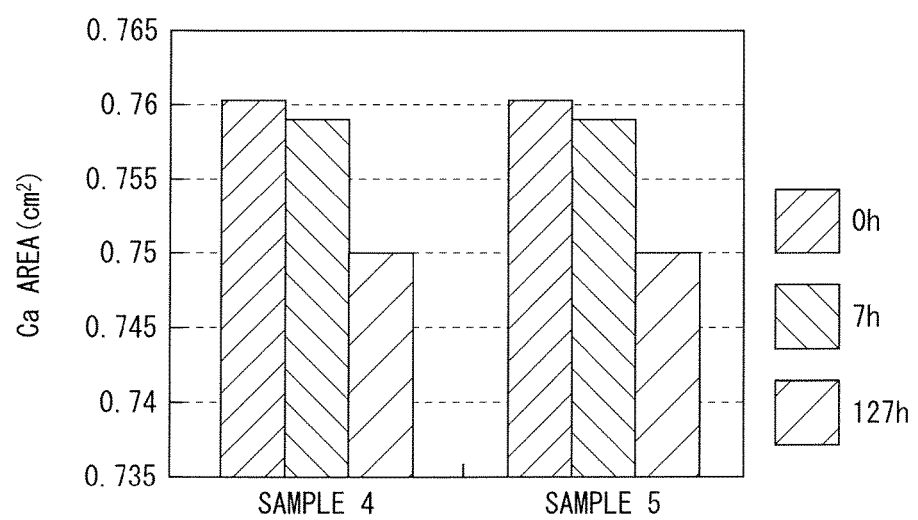

[ FIG. 8A ]
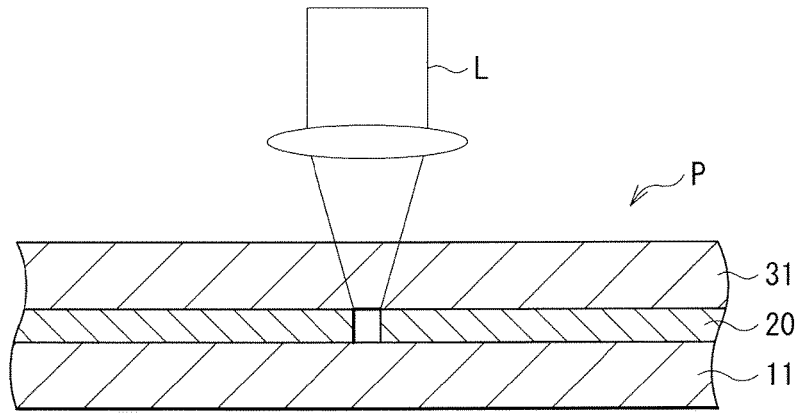
[ FIG. 8B ]
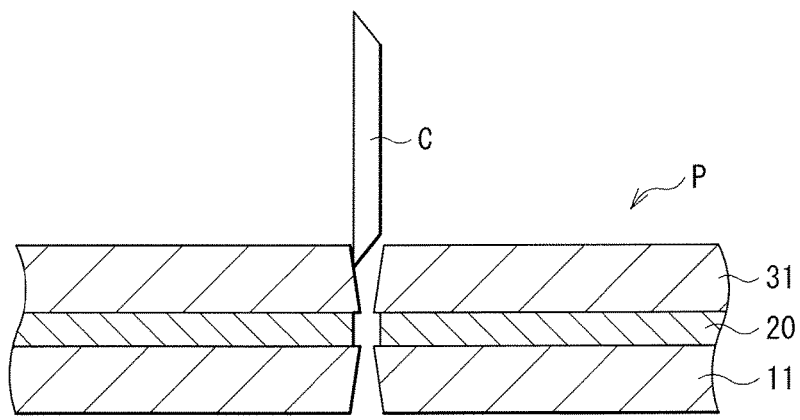
[ FIG. 8C ]
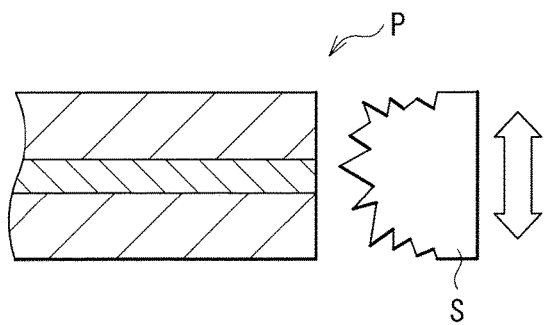

[ FIG. 9 ]
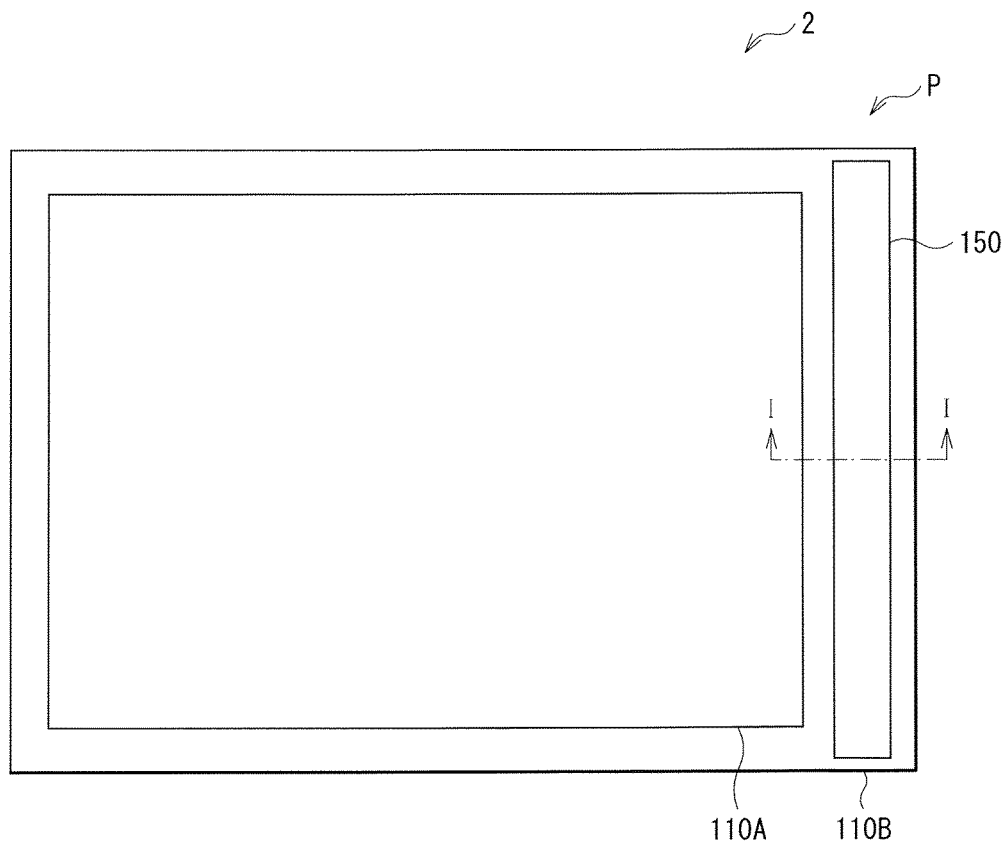

[ FIG. 10 ]
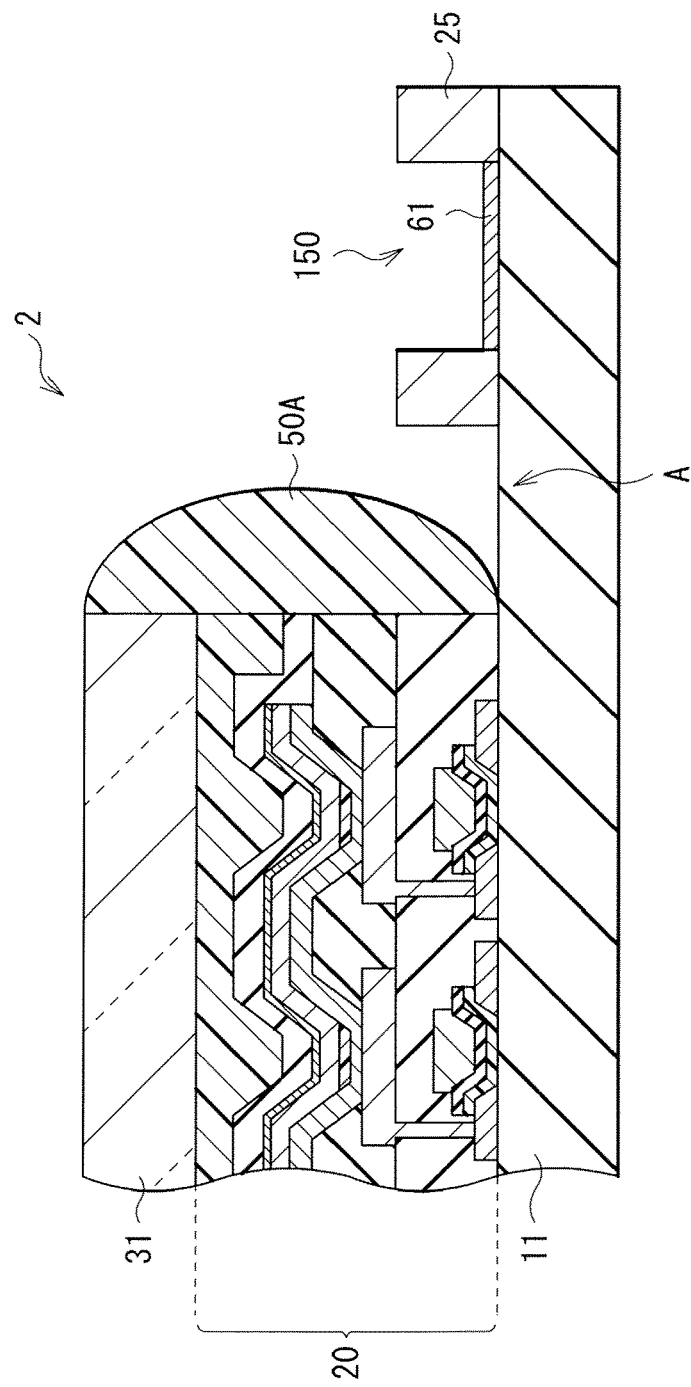

[ FIG. 11 ]
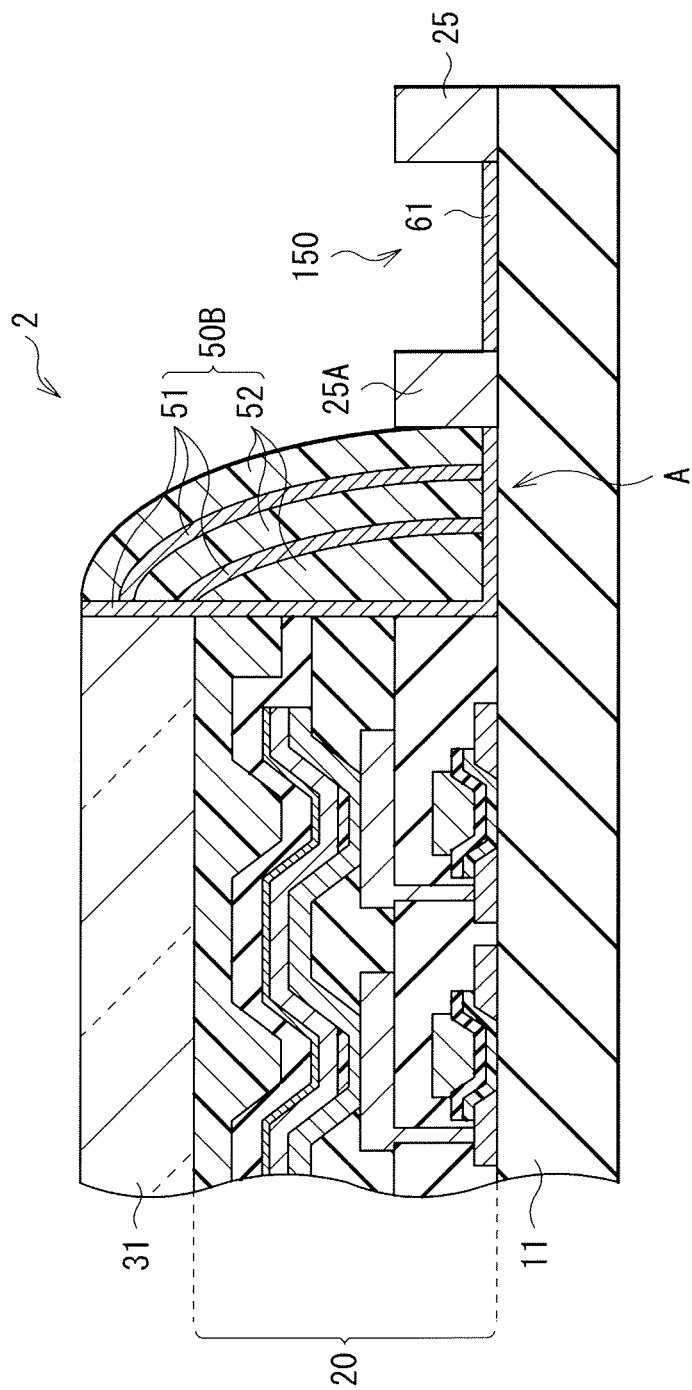

[ FIG. 12 ]
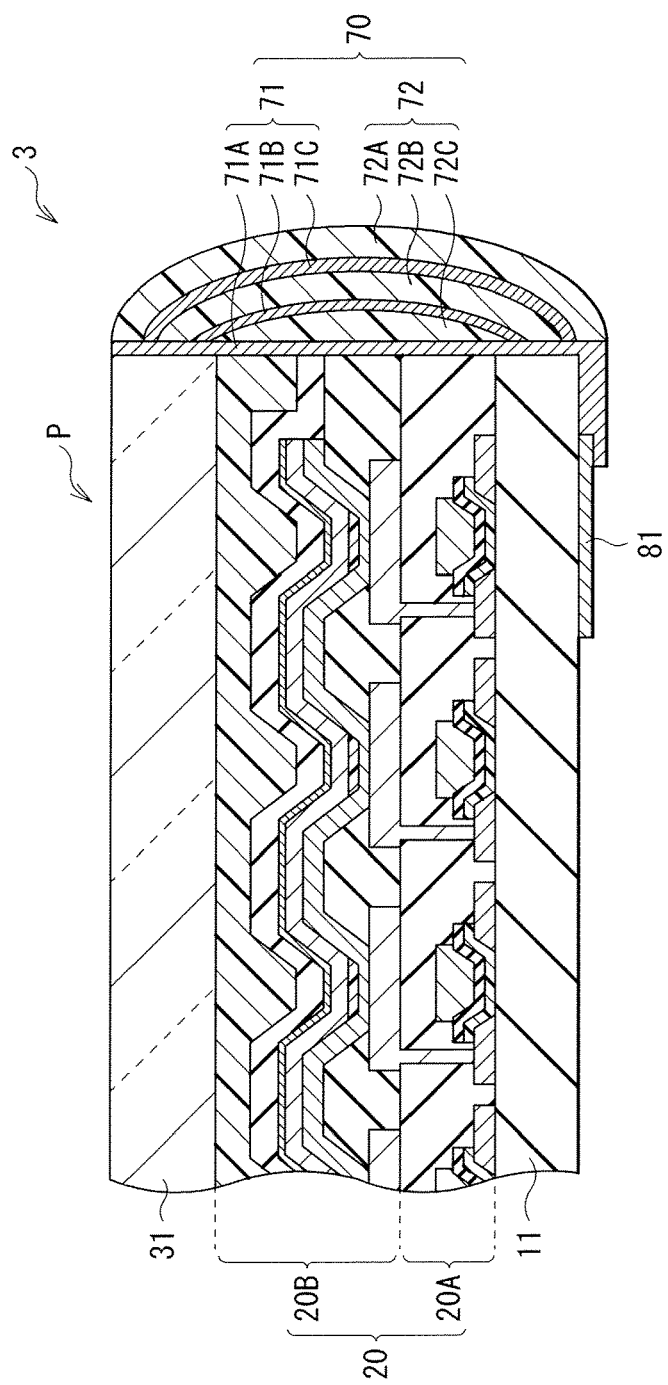

[ FIG. 13 ]
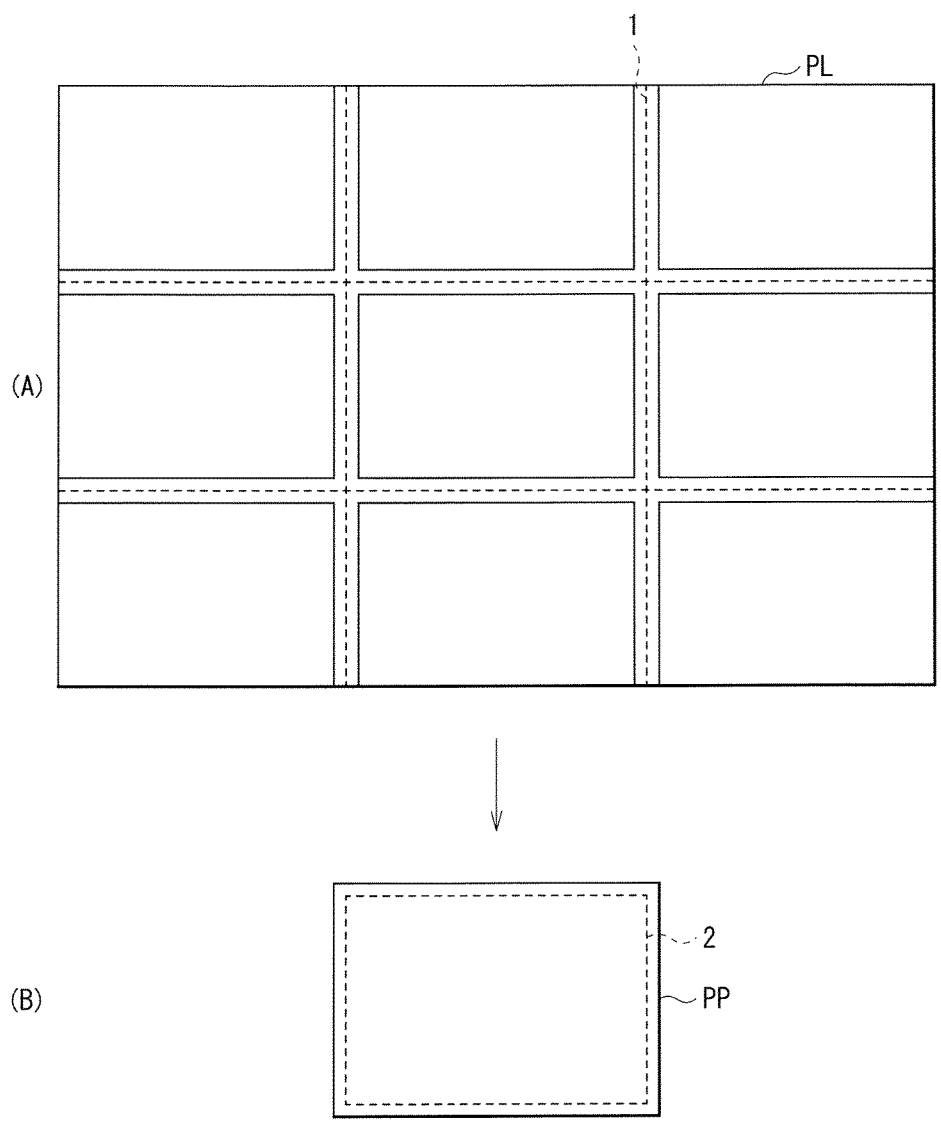

[FIG. 14]
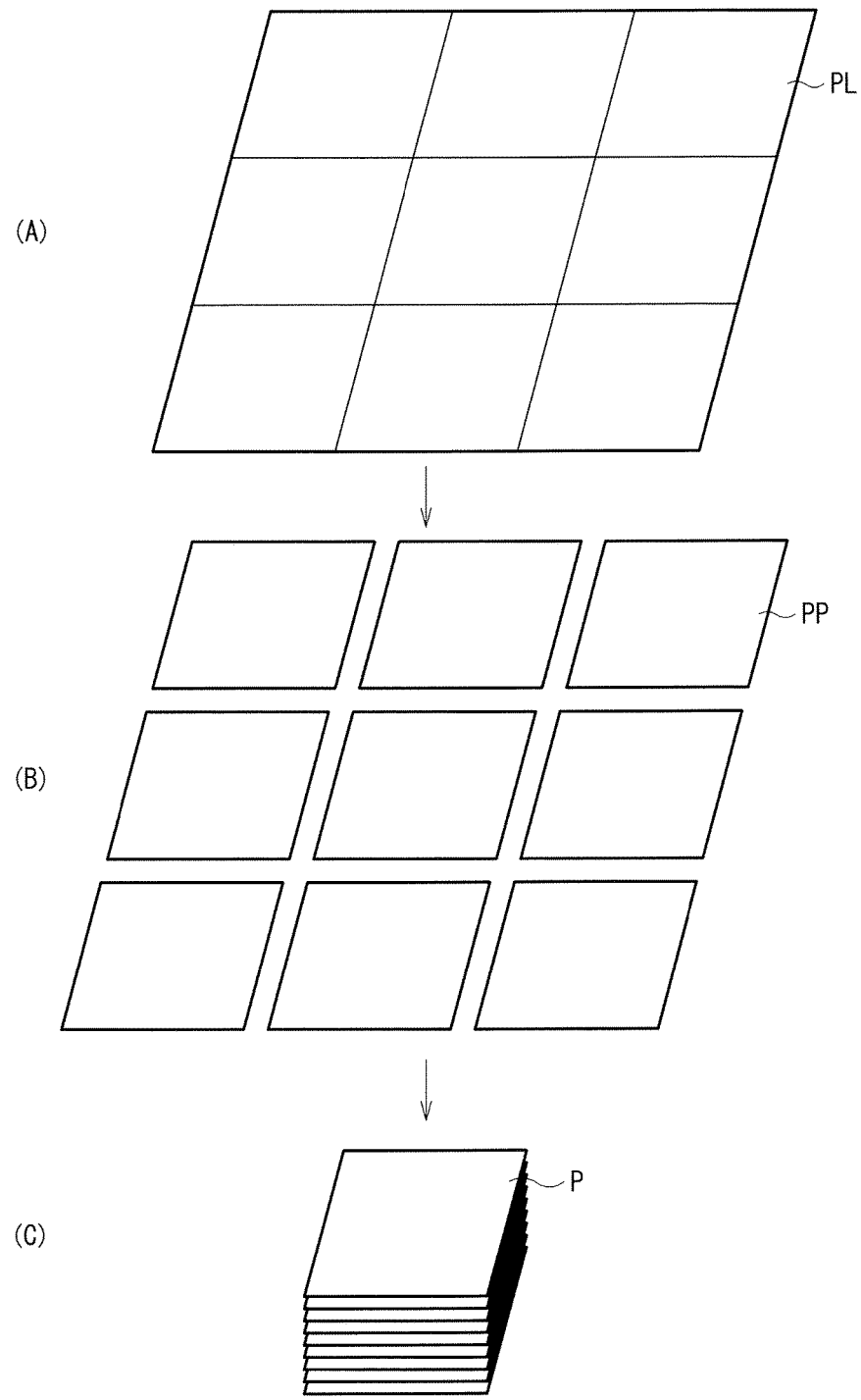

[ FIG. 15 ]
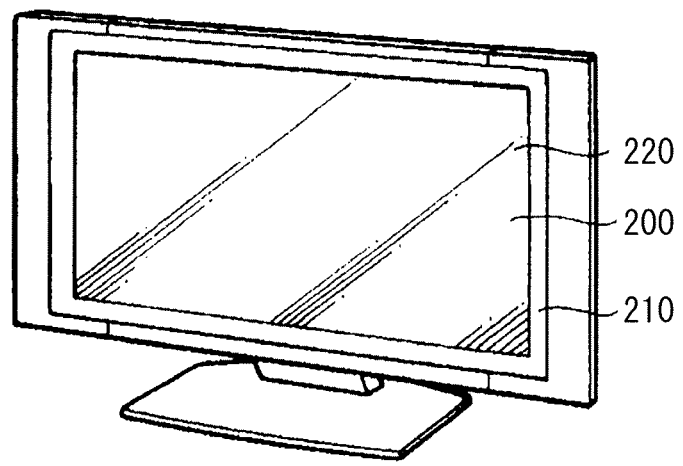
[ FIG. 16 ]
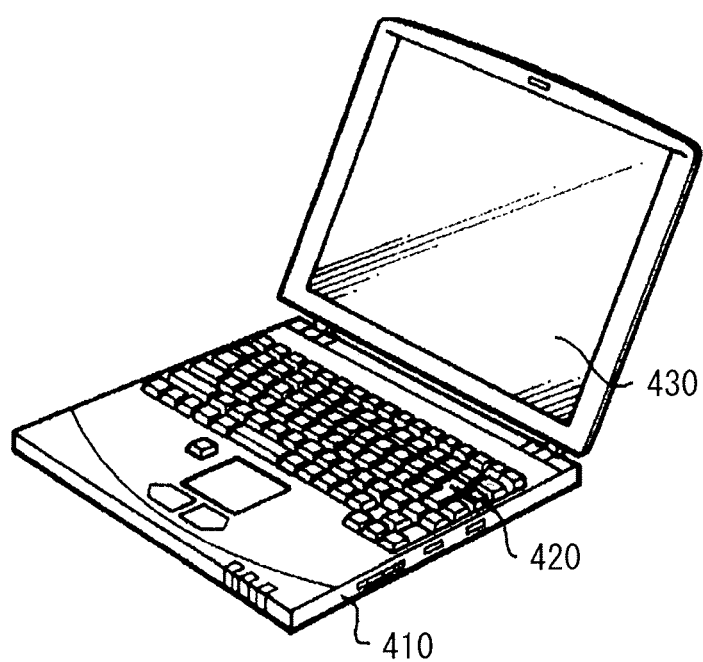

[ FIG. 17A ]
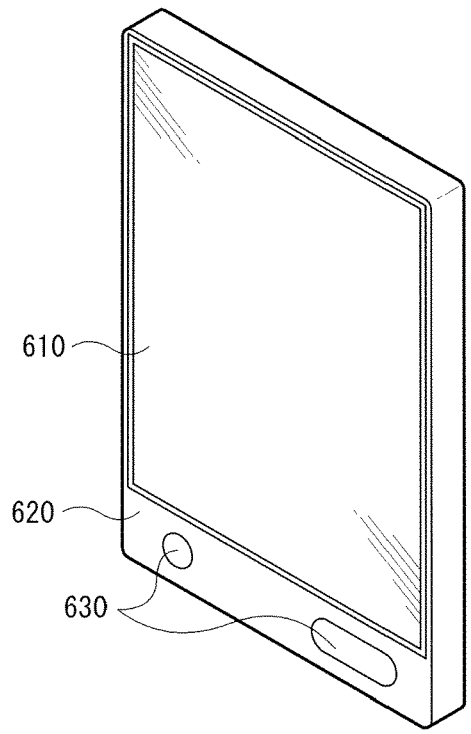
[ FIG. 17B ]
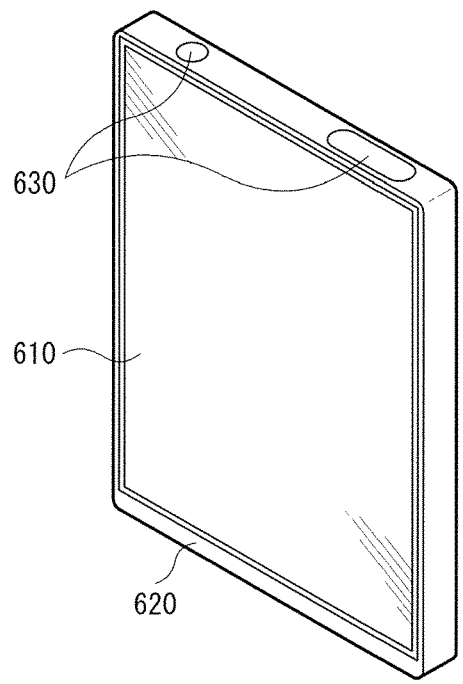

ORGANIC EL DISPLAY UNIT, METHOD OF MANUFACTURING THE SAME, AND ELECTRONIC APPARATUS

TECHNICAL FIELD

The present disclosure relates to an organic electroluminescence (EL) display unit that emits light utilizing an organic EL phenomenon, a method of manufacturing the organic EL display unit, and an electronic apparatus including the organic EL display unit.

BACKGROUND ART

Small-sized to mid-sized display units used for portable devices such as smartphones and tablet terminals have been requested to have a high-definition display performance with low power consumption and to have a thin and light-weight design property. As the display units that meet these requests, a display unit with use of an organic light-emitting device (OLED), i.e., an organic EL display unit has attracted attentions. The organic EL display unit is a self-luminous display unit, and thus has a wide viewing angle and does not necessitate a backlight. Therefore, the organic EL display unit has features such as low power consumption, responsiveness, and decrease in thickness of the display unit itself, compared with a display unit with use of liquid crystal.

Further, the small-sized to mid-sized display units have been requested to enlarge an effective display region as a measure to seek the design property, and thus have been requested to narrow the width of a so-called bezel portion (frame portion) on the periphery of the display region (i.e., narrow bezel has been requested).

The narrow bezel has also been requested in large-sized display units. For the large-sized display units, developments of ultra-multi-pixel displays such as 4K2K displays and 8K4K displays have been under way. Ultra-large-sized displays having a size of 100 inches or more, for example, have been increasingly demanded, because pixel roughness is less likely to be noticeable even when the display region is increased in size. Such ultra-large-sized displays may be achieved by manufacturing an ultra-large-sized display panel through combination of a plurality of display panels in terms of the number and the yield of the ultra-large-sized displays, and the cost. In this case, reduction in the bezel region of the display panels to be combined is requested.

In contrast, the organic EL display unit includes, as a light-emitting device, an organic EL device made of a material containing an organic material. In the organic EL device, layers containing an organic material (organic layers) such as a hole injection layer, a light-emitting layer, and an electron injection layer are stacked between an anode and a cathode. The organic layers react easily with moisture and oxygen in the atmosphere, and are deteriorated. The deteriorated organic layer decreases performances as the light-emitting device, such as decrease in light emission luminance and unstable light emission.

PTL 1 and PTL 2 disclose, as methods for preventing entering of, for example, moisture and oxygen into the organic layer, an organic EL unit in which a region from an emission region to a side surface thereof is covered with a gas barrier layer (or a barrier film) made of an inorganic material.

CITATION LIST

Patent Literature

PTL 1: Japanese Unexamined Patent Application Publication No. 2009-117079

PTL 2: Japanese Unexamined Patent Application Publication No. 2003-282241

SUMMARY OF INVENTION

In the above-mentioned organic EL units, however, an organic layer for flattening irregularities is provided below the gas barrier layer. The gas barrier layer covers the organic layer to thereby prevent entering of moisture from the outside. Here, the organic layer is formed by a method such as a spin coating method and an organic chemical vapor deposition (CVD) method, and thus there is a portion which runs off to the periphery of the emission region. This makes it difficult to narrow the bezel region, because it is necessary for the gas barrier layer that covers the organic layer to be formed larger than the run-off portion of the organic layer.

It is therefore desirable to provide an organic EL display unit that makes it possible to achieve a narrow bezel while keeping reliability, a method of manufacturing the organic EL display unit, and an electronic apparatus.

An organic EL display unit according to an embodiment of the present disclosure includes a first substrate, a second substrate, a display layer including an organic layer provided between the first substrate and the second substrate, and a sealing section provided continuously from an end surface of the display layer to at least a portion of respective end surfaces of the first substrate and the second substrate.

A method of manufacturing an organic EL display unit according to an embodiment of the present disclosure includes forming a display layer including an organic layer on a first substrate, joining the first substrate and a second substrate together, with the display layer being disposed therebetween, and forming a sealing section continuously from an end surface of the display layer to at least a portion of respective end surfaces of the first substrate and the second substrate.

An electronic apparatus according to an embodiment of the present disclosure includes the organic EL display unit according to the present disclosure.

According to the organic EL display unit, the method of manufacturing the organic EL display unit, and the electronic apparatus of the respective embodiments of the present disclosure, there is provided, on the end surface of the display layer including the organic layer provided between the first substrate and the second substrate, the sealing section that is formed continuously from the end surface of the display layer to at least a portion of the respective end surface of the first substrate and the second substrate. This thereby reduces the area of a peripheral region provided on the periphery of the display region while preventing entering of moisture into the organic layer, compared with a common organic EL display unit with a sealing structure provided between substrates.

According to the organic EL display unit, the method of manufacturing the organic EL display unit, and the electronic apparatus of the respective embodiments of the present disclosure, there is provided, on the end surface of the display layer including the organic layer provided between the first substrate and the second substrate, a sealing section that has an overlapping portion at at least a portion of the respective end surfaces of the first substrate and the second substrate. This reduces the area of the peripheral region provided on the periphery of the display region while preventing entering of moisture into the organic layer, compared with a common organic EL display unit with a sealing structure provided between substrates. Thus, it becomes possible to provide the organic EL display unit that has a narrow bezel region while keeping reliability and the electronic apparatus including the organic EL display unit. It is to be noted that the effects described herein are not necessarily limitative, and may be any effects described in the present disclosure.

BRIEF DESCRIPTION OF DRAWINGS

FIG. 1 is a cross-sectional view of a configuration of a display unit according to an embodiment of the present disclosure.

FIG. 2 is a plan view of an overall configuration of the display unit illustrated in FIG. 1.

FIG. 3 illustrates an example of a pixel drive circuit illustrated in FIG. 2.

FIG. 4 is an explanatory schematic view of an entering path of moisture in a sealing section of an embodiment of the present disclosure.

FIG. 5 is a flowchart illustrating an example of steps for manufacturing the display unit illustrated in FIG. 1.

FIG. 6A is an explanatory schematic view of an example of a dividing method.

FIG. 6B is a schematic view of a state subsequent to that illustrated in FIG. 6A.

FIG. 7 is a characteristic diagram in which characteristics of divided surfaces are compared which are formed by the dividing method illustrated in FIGS. 6A and 6B.

FIG. 8A is an explanatory schematic view of another example of the dividing method.

FIG. 8B is an explanatory schematic view of the dividing method in a state subsequent to that illustrated in FIG. 8A.

FIG. 8C is an explanatory schematic view of the dividing method in a state subsequent to that illustrated in FIG. 8B.

FIG. 9 is a plan view of an overall configuration of a display unit according to Modification Example 1 of the present disclosure.

FIG. 10 is a cross-sectional view of an example of a cross-sectional configuration of the display unit illustrated in FIG. 9.

FIG. 11 is a cross-sectional view of another example of the cross-sectional configuration of the display unit illustrated in FIG. 9.

FIG. 12 is a cross-sectional view of a display unit according to Modification Example 2 of the present disclosure.

FIG. 13 is an explanatory schematic view of one of steps for manufacturing a display unit according to Modification Example 3 of the present disclosure.

FIG. 14 is a further explanatory schematic view of one of the manufacturing steps illustrated in FIG. 13.

FIG. 15 is a perspective view of an outer appearance of Application Example 1 with use of the display unit of the present disclosure.

FIG. 16 is a perspective view of an outer appearance of Application Example 2.

FIG. 17A is a perspective view of an example of an outer appearance of Application Example 3.

FIG. 17B is a perspective view of another example of an outer appearance of Application Example 3.

DESCRIPTION OF EMBODIMENTS

Some embodiments of the disclosure are described in detail below in the following order with reference to drawings.
1. Embodiment (A display unit having a sealing section on an end surface of a display panel)
    1-1. Overall Configuration
    1-2. Manufacturing Method
    1-3. Function and Effect
2. Modification Example
    Modification Example 1 (A display unit having a terminal section at a side of a display panel)
    Modification Example 2 (A display unit having a wiring line on a rear surface of a substrate)
    Modification Example 3 (A dividing method in a step for a mass production of a display panel)
3. Application Example (An application example to an electronic apparatus)

[1. Embodiment]
(1-1. Overall Configuration)

FIG. 1 illustrates a cross-sectional configuration of an organic EL display unit (display unit 1) according to an embodiment of the present disclosure. The display unit 1 is used as an organic EL television, for example. The display unit 1 includes a drive substrate 11 on which there are provided a display region 110A and a peripheral region 110B on the periphery of the display region 110A (see FIG. 2). The display unit 1 is, for example, a top surface emission (so-called top emission) display unit. The top surface emission display unit uses, as light-emitting devices, an organic EL device 10 that emits any of color light beams of R (red), G (green), and B (blue) (a red organic EL device 10R, a green organic EL device 10G, a blue organic EL device 10B), and the color light beams are emitted from top surface side (side opposite to the drive substrate 11). The display unit 1 according to the present embodiment includes a display layer 20 that configures the organic EL device 10, and the drive substrate 11 and a counter substrate 31 provided to face each other with the display layer 20 being interposed therebetween. The display layer 20, the drive substrate 11, and the counter substrate 31 configure a display panel P. A sealing section 50 that covers at least the display layer 20 is provided on an end surface of the display panel P.

FIG. 2 illustrates an example of an overall configuration of the display unit 1 illustrated in FIG. 1. In the display region 110A, there are disposed a plurality of pixels 5 (red pixels 5R, green pixels 5G, and blue pixels 5B) in matrix. Further, a signal line drive circuit 120 and a scanning line drive circuit 130 which are drivers for displaying an image are provided in the peripheral region 110B positioned on the periphery (on outer edge side, or on outer peripheral side) of the display region 110A.

A pixel drive circuit 140 is provided inside the display region 110A. FIG. 3 illustrates an example of the pixel drive circuit 140 (an example of pixel circuits of the red pixels 5R, the green pixels 5G, and the blue pixels 5B). The pixel drive circuit 140 is an active drive circuit provided below a pixel electrode 26 described later. The pixel drive circuit 140 includes a drive transistor Tr1, a write transistor Tr2, a capacitor (a holding capacitor) Cs located between these transistors Tr1 and Tr2. The pixel drive circuit 140 also includes the organic EL device 10 coupled in series to the drive transistor Tr1 between a first power supply line (Vcc) and a second power supply line (GND). In other words, the organic EL device 10 is provided in each of the red pixels 5R, the green pixels 5G, and the blue pixels 5B. Each of the drive transistor Tr1 and the write transistor Tr2 is configured by a typical thin film transistor (TFT), and may have, for example, an inverted staggered structure (a so-called bottom gate type) or a staggered structure (a top gate type); the configuration thereof is not particularly limited.

In the pixel drive circuit 140, a plurality of signal lines 120A are arranged in a column direction, and a plurality of scanning lines 130A are arranged in a row direction. An intersection of each of the signal lines 120A and each of the scanning lines 130A corresponds to one of the red pixel 5R, the green pixel 5G, and the blue pixel 5B. Each of the signal lines 120A is coupled to the signal line drive circuit 120, and an image signal is supplied from the signal line drive circuit 120 to a source electrode of the write transistor Tr2 through the signal line 120A. Each of the scanning lines 130A is coupled to the scanning line drive circuit 130, and a scanning signal is sequentially supplied from the scanning line drive circuit 130 to a gate electrode of the write transistor Tr2 through the scanning line 130A.

In the display unit 1 of the present embodiment, the sealing section 50 is provided on the end surface of the display panel P including the display layer 20 between the drive substrate 11 and the counter substrate 31 as described above. The sealing section 50 is provided for suppressing entering of moisture into the display layer 20 (more specifically, an organic layer 28); the sealing section 50 may preferably cover at least the display layer 20 of the display panel P. More preferably, an end of the sealing section 50 may be so provided as to overlap a portion of respective end surfaces of the drive substrate 11 and the counter substrate 31 being in contact with the display layer 20.

While the sealing section 50 that is formed of only an inorganic film 51 made of an inorganic material is able to suppress the entering of moisture into the display layer 20 (more specifically, organic layer 28), a layered structure of the inorganic film 51 and an organic film 52 is able to suppress the entering of moisture into the display layer 20 even more. Table 1 summarizes calculations of moisture vapor transmission rate by measuring corrosiveness of calcium in Samples 1 to 3 prepared as described below. It is to be noted that the measuring condition of the corrosiveness of calcium was set such that temperature was 60° C. and humidity was 90% (relative humidity). Sample 1 is a film substrate (polyethylene naphthalate (PEN) substrate; having a thickness of 100 μm) on which a calcium (Ca) film is formed, with a PEN substrate being joined thereto. Sample 2 includes a filling layer provided on a Ca film, with a UV-cured resin film with a thickness of 3 μm, for example, and an inorganic film (an aluminum oxide ($Al_2O_3$) film) with a thickness of 25 nm, for example, being formed in this order on the filling layer. Sample 3 further includes a UV-cured resin film and an $Al_2O_3$ film being stacked in addition to the configuration of Sample 2.

TABLE 1

| | Configuration | Moisture Vapor Transmission Rate (g/m²/day) |
|---|---|---|
| Sample 1 | Film Substrate (PEN) | 6.0E |
| Sample 2 | PEN/Filling Layer/UV-Cured Resin Film/$Al_2O_3$ Film | 6.9E−3 |
| Sample 3 | PEN/Filling Layer/UV-Cured Resin Film/$Al_2O_3$ Film/ UV-Cured Resin Film/$Al_2O_3$ Film | 5.9E−5 |

It is appreciated from Table 1 that configuring the sealing section 50 by the layered structure of the inorganic film 51 and the organic film 52 enables the effect of suppressing the entering of moisture into the display layer 20 to be enhanced. Further, it is appreciated that providing the layered films of the inorganic film 51 and the organic film 52 in a stacked manner enables the suppressing effect to be further enhanced. This is because of the film property of the inorganic film 51. There is a concern that the inorganic film 51 may cause a minute flaw due to dust that may attach thereto in the middle of film formation or due to a defect during the film formation. The dust attached during the film formation or the flaw may be the cause of the entering of moisture from the outside. Therefore, formation of the organic film 52 on the surface of the inorganic film 51 makes it possible to cover the dust and to prevent the flaw of the inorganic film 51, thus delaying the entering of moisture into the display layer 20.

The sealing section 50 may preferably have a multi-layered structure in which two or more layered films each configured by the inorganic film 51 and the organic film 52 being stacked. FIG. 4 schematically illustrates an entering path of moisture H in a portion of the configuration of the sealing section 50 in the display unit illustrated in FIG. 1. For example, even when a flaw is formed in each of the inorganic films 51B and 51C as illustrated in FIG. 4, a diffusion rate of the moisture H having entered the inorganic film 51C through the flaw is suppressed due to a maze effect in which the moisture H passes through the organic film 52B provided therebetween to reach a flaw of the inorganic film 51B. In this manner, stacking the inorganic film 51 and the organic film 52 alternately makes it possible to suppress the diffusion rate of the moisture H efficiently. More specifically, for example, three layers of the inorganic film 51 and three layers of the organic film 52 may be preferably formed; in other words, an inorganic film 51A, an organic film 52A, an inorganic film 51B, an organic film 52B, an inorganic film 51C, and an organic film 52C may be preferably formed from the end surface of the display panel P as illustrated in FIG. 1. The film-formation width of the outermost organic film 52C may be preferably substantially the same as the film thickness (hereinafter, referred to simply as "thickness") of the display panel P in the Y-axis direction. More specifically, the film-formation width of the outermost organic film 52C may be preferably set such that the end surfaces of the organic film 52C in the Y-axis direction reach respective surfaces (surface of the drive substrate 11 and surface of the counter substrate 31 opposite to the facing surface thereof) of the display panel P as illustrated in FIG. 1.

The material of the inorganic film 51 may be desirably aluminum oxide ($Al_2O_3$), for example. Other examples of the material of the inorganic film 51 may include silicon oxide ($SiO_2$), zirconium oxide ($ZrO_2$), titanium oxide ($TiO_2$), zinc oxide ($ZnO_2$), indium-zinc oxide (IZO), indium-tin oxide (ITO), indium-gallium-zinc oxide (IGZO), aluminum-zinc oxide (AZO), gallium-zinc oxide (GZO), silicon nitride (SiN), and silicon oxynitride (SiON). Further, a metal film made of a metal such as aluminum (Al) and titanium (Ti) may also be adopted. It is preferable to use one or more of these materials for formation of the inorganic film 51. In addition, a common material for a wiring line may also be used for the formation thereof. More specific examples of the common wiring line material may include ruthenium (R), platinum (Pt), iridium (Ir), palladium (Pd), rhodium (Rh), gold (Au), silver (Ag), copper (Cu), nickel (Ni), cobalt (Co), iron (Fe), manganese (Mn), tantalum (Ta), tungsten (W), molybdenum (Mo), titanium (Ti), aluminum (Al), silicon (Si), germanium (Ge), and zinc (Zn). One or more of these materials or an alloy thereof may also be used for the formation. Examples of available film-forming method for the inorganic film 51 may include a sol-gel method, a sputtering method, a vacuum vapor deposition method, a chemical vapor deposition (CVD) method, and an atomic layer deposition method (ALD; HYPERLINK "javascript: void (0)"). In particular, the ALD method may be preferably used for the film formation, and the film thickness (thickness) thereof may be preferably equal to or more than 10 nm and equal to or less than 200 nm.

As the material of the organic film 52, a material having good adhesion (affinity) to the inorganic film 51 may be preferable in order to enhance a sealing property of the sealing section 50. More specific examples of the material of the organic film 52 may include a cured resin composition containing a cycloalkane structure-containing polymerizable compound or a high-acid value phthalic acid structure-containing polymerizable compound.

When the sealing section 50 has a multi-layered structure in which the layered films of the inorganic film 51 and the organic film 52 are stacked as described above, it is desirable that end surfaces of the organic films (organic films 52A and 52B of the organic film 52 illustrated in FIG. 1) formed on end surface side may not be exposed to the outside. The organic film does not have a sufficient moisture-sealing capacity. Accordingly, when the end surface of the organic film formed near the end surface of the display panel P is exposed to the outside, the end surface of the organic film results in serving as the entering path of moisture into the display layer 20. Therefore, in the sealing section 50 having the multi-layered structure of the inorganic film 51 and the organic film 52, the inorganic film 51 formed on the organic film 52 is requested to cover the whole of the underlying organic film 52 so as to be blocked from the outside. In other words, the film-formation width (D) of the organic film 52 may be preferably greater gradually in the order of the film formation. More specifically, the film-formation width of the organic films 52A, 52B, and 52C that configure the sealing section 50 as illustrated in FIG. 1 may preferably have a relationship of respective widths D1, D2, and D3, in which D1 is less than D2 and D2 is less than D3 (D1<D2<D3).

The thickness of the organic film 52 may be preferably as thin as possible. This is because the bezel region of the display unit 1 is substantially determined by the thickness of the organic film 52, since it is possible to form the inorganic film 51 to be much thinner than the organic film 52. However, the organic film 52 has a role of suppressing the diffusion rate of moisture when the inorganic film 52 has a flaw as described above. Further, the outermost organic film 52 (organic film 52C) functions as a protective film of the inorganic film 51 (inorganic film 51C). Therefore, the organic film 52 may preferably have a thickness of equal to or more than 3 μm and equal to or less than 30 μm, for example.

As a method of forming such an organic film 52, a method is contemplated in which, for example, a liquid organic agent may be applied and cured. This makes it possible to fill minute irregularities formed on the inorganic film 52 without gap. It is to be noted that the liquid organic agent may preferably have lowered viscosity for use in order to effectively utilize a capillary phenomenon thereof, for example. Examples of the specific film-forming method may include a dispensing method in which a liquid organic agent is dispensed with an air pressure or a mechanical pressure, an inkjet method, and an offset method.

The dispensing method enables the application width to be more slender and thinner by narrowing the distance between a nozzle and an application surface with use of a slender nozzle. Thus, the application width may be set depending on a nozzle size and an application condition, which brings high general-purpose properties. The inkjet method enables the application amount per drop to be a micro amount, thus making it possible to control the film-formation width and the thickness precisely. The offset method involves immersing an offset component in a liquid agent and transferring the offset component to an application section. The offset method brings the offset component into direct contact with the application section, and thus has difficulty in being applied to film formations of a second layer and subsequent layers. However, by making the width of the offset component thinner and by quantifying the amount of the liquid agent for immersion, it becomes possible to form an organic film having stable film-formation width and thickness, which enables the productivity to be enhanced. It is to be noted that examples of the application method limited to the second layer and subsequent layers may include a dip method.

Bringing the offset component into contact with an application surface at an angle makes it possible to reduce dispersion in the application width and the thickness, while reducing an influence caused by the contact. In addition, vacuum may also be used in the application process.

The present embodiment describes an example of the sealing section 50 having a configuration in which the inorganic film 51A is formed directly on the end surface of the display panel P, with the organic film 52A, the inorganic film 51B, the organic film 52B, the inorganic film 51C, and the organic film 52C are stacked in this order on the inorganic film 51A. However, when the surface of the end surface of the display panel P is rough, for example, an unillustrated flattening film containing an organic material may also be formed, as an underlayer, on the surface of the end surface. The flattening film fills the minute irregularities of the end surface of the display panel P without gap, thereby making it possible to stabilize the film properties of the inorganic film 51 and the organic film 52 to be formed thereafter and to suppress the thicknesses thereof to the minimum. Examples of the method of forming the flattening film may include a method in which a liquid organic agent is applied and cured for film formation similarly to the above-described method of forming the organic film 52.

Hereinafter, respective components that configure the display panel P are described. As described above, the display panel P includes the drive substrate 11 and the counter substrate 31 that are disposed to face each other with the display layer 20 being interposed therebetween. The display layer 20 is configured by a semiconductor section 20A and a display section 20B. A transistor 20X that drives each of the organic EL devices 10R, 10G, and 10B is provided in the semiconductor section 20A. The organic EL devices 10R, 10G, and 10B are provided in the display section 20B. It is to be noted that, in the present embodiment, the drive substrate 11 and the counter substrate 31 have a complete solid structure in which the entire surfaces thereof are joined together with an adhesive layer 40.

The drive substrate 11 is a supporting body with a main surface side on which the organic EL devices 10 of respective colors (red organic EL device 10R, green organic EL device 10G, and blue organic EL device 10B) are formed in an array. Examples of an available substrate for the drive substrate 11 may include quartz and glass; a substrate made of a plastic such as polyether sulfone, polycarbonate, polyimides, polyamides, polyacetals, polyethylene terephthalate, polyethylene naphthalate, polyethylene ether ketone, and polyolefins; a metal foil substrate made of a metal such as aluminum (Al), nickel (Ni), copper (Cu), and stainless steel having undergone a surface insulating treatment; and paper. A buffer layer for enhancing adhesion and flatness or a functional film such as a barrier film for enhancing a gas barrier property may also be formed on the above-described substrate. Further, when it is possible to form a channel layer 22 without heating the drive substrate 11 by methods such as a sputtering method, it is also possible to use an inexpensive plastic film as the drive substrate 11.

The transistor Tr1 for driving and the transistor Tr2 for writing and various wiring lines are provided in the semiconductor section 20A on the drive substrate 11. A flattening insulating film 25 is provided on the transistors Tr1 and Tr2 and the wiring lines. While the transistors Tr1 and Tr2 (hereinafter, referred to as a thin film transistor 20X) may be either a top gate type or a bottom gate type, the thin film transistor 20X of a top gate type is used for description in this example. The thin film transistor 20X has a configuration in which a pair of source/drain electrodes (a source electrode 21A and a drain electrode 21B), the channel layer 22, a gate insulating film 23, and a gate electrode 24 are provided in this order from drive substrate 11 side, with the flattening insulating film 25 that flattens the semiconductor section 20A being further provided.

The source electrode 21A and the drain electrode 21B are provided apart from each other, and are electrically coupled to the channel layer 22. A metal material and a semi-metal or inorganic semiconductor material may be used as the material forming the source electrode 21A and the drain electrode 21B. Specific examples of the material may include a metal simple substance such as platinum (Pt), titanium (Ti), ruthenium (Ru), molybdenum (Mo), copper (Cu), tungsten (W), nickel (Ni), aluminum (Al), gold (Au), silver (Ag), and tantalum (Ta); and an alloy thereof. Other examples thereof may include indium-tin oxide (ITO) and molybdenum oxide (MoO). The source electrode 21A and the drain electrode 21B are made of any of the metal simple substances or an alloy thereof a monolayer thereof or two or more layers thereof may also be stacked for use. Examples of the layered structure may include layered structures of Ti/Al/Ti and Mo/Al. Further, the wiring line 27A may also have a configuration similar to those of the source electrode 21A and the drain electrode 21B.

The channel layer 22 is provided in an island shape between the source electrode 21A and the drain electrode 21B, and has a channel region at a position facing the gate electrode 24 described later. The channel layer 22 may have a thickness of 5 nm to 100 nm, for example. The channel layer 22 may be made of, for example, an organic semiconductor material such as a peri-Xanthenoxanthene (PXX) derivative. Examples of the organic semiconductor material may include polythiophene, poly-3-hexylthiophene (P3HT) in which a hexyl group is introduced into polythiophene pentacene[2,3,6,7-dibenzoanthracene], polyanthracene, naphthacene, hexacene, heptacene, dibenzopentacene, tetrabenzopentacene, chrysene, perylene, coronene, Terrylene, ovalene, quoterrylene, circumanthracene, benzopyrene, dibenzopyrene, triphenylene, polypyrrole, polyaniline, polyacetylene, polydiacetylene, polyphenylene, polyfuran, polyindole, polyvinyl carbazole, polyselenophene, polytellurophene, polyisothianaphthene, polycarbazole, polyphenylene sulfide, polyphenylene vinylene, polyphenylene sulfide, polyvinylene sulfide, polythienylene vinylene, polynaphthalene, polypyrene, polyazulene, phthalocyanines represented by copper phthalocyanine, merocyanine, hemicyanine, polyethylene dioxythiophene, pyridazine, naphthalene tetracarboxylic acid diimide, poly(3,4-ethylendioxythiophene)/polystyrenesulfonic acid (PEDOT/PSS), 4,4'-biphenyldithiole (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine (biphenyl-4-4'-diamine), TCNQ (tetracyanoquinodimethane), charge-transfer complexes represented by a tetrathiafulvalene (TTF)-TCNQ complex, a bisethylenetetrathiafulvalene (BEDTTTF)-perchloric acid complex, a BEDTTTF-iodine complex, and a TCNQ-iodine complex, biphenyl-4,4'-dicarboxylic acid, 24-di(4-thiophenylacetylinyl)-2-ethylbenzene, 24-di(4-isocyanophenylacetylinyl)-2-ethylbenzene, dendrimer, fullerenes such as C60, C70, C76, C78, and C84, 24-di(4-thiophenylethynyl)-2-ethylbenzene, 2,2''-dihydroxy-1,1':4', 1''-terphenyl, 4,4'-biphenyldiethanal, 4,4'-biphenyldiol, 4,4'-biphenyldisocyanate, 24-diacetylbenzene, diethylbiphenyl-4,4'-dicarboxylate, benzo[22-c;3,4-c';5,6-c'']tris[22]dithiol-24,7-trithion, α-sexithiophene, tetrathiotetracene, tetraselenotetracene, tetratelluric tetracene, poly(3-alkyl thiophene), poly(3-thiophene-(3-ethanesulfonic acid), poly (N-alkylpyrrole)poly(3-alkylpyrrole), poly(3,4-dialkylpyrrole), poly(2,2'-thienylpyrrole), and poly(dibenzothiophene sulfide), and quinacridone. In addition, it is also possible to use a compound selected from the group consisting of condensed polycyclic aromatic compounds, porphyrin derivatives, phenyl vinylidene-based conjugated oligomers, and thiophene-based conjugated oligomers. Further, a mixture of an organic semiconductor material and an insulating polymer material may also be used.

The channel layer 22 may be formed using the vacuum vapor deposition method; however, for example, the above-mentioned material may be preferably dissolved in an organic solvent, for example, to be used as an ink solution in application/printing process to form the channel layer 22. This is because the application/printing process allows for cost reduction compared with the vacuum vapor deposition method and is effective for enhancement of throughput. Specific examples of the application/printing process may include methods such as cast coating, spin coating, spray coating, inkjet printing, relief printing, flexo printing, screen printing, gravure printing, and gravure offset printing.

The gate insulating film 23 is provided within a thickness range of, for example, 50 nm to 1 μm both inclusive between the channel layer 22 and the gate electrode 24. The gate insulating film 23 may be formed by an insulating film containing one or more of silicon oxide (SiO), silicon nitride (SiN), silicon oxynitride (SiON), hafnium oxide (HfO), aluminum oxide (AlO), aluminum nitride (AlN), tantalum oxide (TaO), zirconium oxide (ZrO), hafnium oxynitride, hafnium-silicon oxynitride, aluminum oxynitride, tantalum oxynitride, and zirconium oxynitride, for example. The gate insulating film 23 may have either a monolayer structure, or a layered structure, for example, using two or more materials such as an SiN film and an SiO film. When the gate insulating film 23 has the layered structure, it is possible to improve interface properties with respect to the channel layer 22 and to effectively suppress mixing of impurities (e.g., moisture) into the channel layer 22 from the outside. The gate insulating film 23 is formed by application, and thereafter is patterned into a predetermined shape with etching. Depending on a material, the pattern formation may be performed by a printing technique such as inkjet printing, screen printing, offset printing, and gravure printing.

The gate electrode 24 has a role of applying a gate voltage to the thin film transistor 20X to control carrier density in the channel layer 22 with the gate voltage. The gate electrode 24 is provided in a selective region on the drive substrate 11, and may be made of, for example, a metal simple substance such as platinum (Pt), titanium (Ti), ruthenium (Ru), molybdenum (Mo), copper (Cu), tungsten (W), nickel (Ni), aluminum (Al), and tantalum (Ta), or an alloy thereof. Alternatively, two or more thereof may also be stacked for use.

The flattening insulating film 25 is provided for preventing a short circuit between respective wiring lines (source electrode 21A and drain electrode 21B, channel layer 22, or gate electrode 24), and for flattening the surface of the drive substrate 11 on which the thin film transistor 20X is provided. Examples of the material for forming the flattening insulating film 25 may include polyimide-based, polyacrylate-based, epoxy-based, cresol novolak-based or polystyrene-based, polyamide-based, and fluorine-based organic insulating materials; and inorganic materials such SiO.

The display section 20B includes the light-emitting device 10, and is provided on the semiconductor section 20A, more specifically, on the flattening insulating film 25. The light-emitting device 10 is a light-emitting device in which the pixel electrode 26 as an anode, a partition wall 27, the organic layer 28 including a light-emitting layer 28B, and a counter electrode 29 as a cathode are stacked in this order from semiconductor section 20A side. The counter substrate 31 is joined onto the counter electrode 29 with the adhesive layer 40 being provided therebetween. The thin film transistor 20X and the light-emitting device 10 are electrically coupled to the pixel electrode 26 through a connection hole 25A provided in the flattening insulating film 25.

The pixel electrode 26 also serves as a reflection layer; it is desirable to have as high reflectance as possible in order to enhance emission efficiency. In particular, when using the pixel electrode 26 as an anode, it is desirable that the pixel electrode 26 may be made of a material having a high hole injection property. Examples of the material of the pixel electrode 26 may include a metal simple substance such as aluminum (Al), chromium (Cr), gold (Au), platinum (Pt), nickel (Ni), copper (Cu), tungsten (W), and silver (Ag), and an alloy thereof. A transparent electrode, which has a large work function, may preferably be stacked on the surface of the pixel electrode 26.

The partition wall 27 is provided for securing an insulating property with respect to the pixel electrode 26 and the counter electrode 29 and for forming an emission region into a desired shape. The partition wall 27 is made of a photosensitive resin, for example. The partition wall 27 is provided only around the pixel electrode 26, and a region, exposed from the partition wall 27, of the pixel electrode 26 serves as the emission region. It is to be noted that, while the organic layer 28 and the counter electrode 29 are provided also on the partition wall 27, only the emission region generates light emission.

The organic layer 28 has a configuration in which, for example, a hole supply layer 28A (hole injection layer 28A1, hole transport layer 28A2), the light-emitting layer 28B, and an electron supply layer 28C (electron transport layer 28C1, electron injection layer 28C2) are stacked in order from pixel electrode 26 side. It is sufficient for these layers to be provided as necessary. The layers that form the organic layer 28 may have different configurations from each other depending on, for example, emission colors of the organic EL devices 10R, 10G, and 10B. The hole injection layer 28A1 is provided for enhancing hole injection efficiency, and also serves as a buffer layer that prevents a leak. The hole transport layer 28A2 is provided for enhancing efficiency of transporting holes to the light-emitting layer. The light-emitting layer 28B performs application of an electric field to cause recombination of electrons and holes, thus emitting light. The organic EL devices 10R, 10G, and 10B includes, respectively, light emitting-layers 28BR, 28BG, and 28BB that emit corresponding color light beams. The electron transport layer 28C1 is provided for enhancing efficiency of transporting electrons to the light-emitting layer 28B. The electron injection layer 28C2 is provided for enhancing electron injection efficiency.

The counter electrode 29 is formed of any of alloys of aluminum (Al), magnesium (Mg), calcium (Ca), and sodium (Na), for example. Among the alloys, an alloy of magnesium and silver (Mg—Ag alloy) may be preferable because it has both electrical conductivity and low absorbability in a thin film. The ratio of magnesium to silver in the Mg—Ag alloy is not particularly limited; however, the film thickness ratio of magnesium to silver may be preferably within a range of Mg:Ag=20:11 to 1:1. Further, the material of the counter electrode 29 may also be an alloy of aluminum (Al) and lithium (Li) (Al—Li alloy).

A protective film 30 is provided on the counter electrode 29 so as to cover the end surfaces of the organic layer 28 and the counter electrode 29, for example. The protective film 30 may be made of, for example, an inorganic material such as silicon oxide ($SiO_x$), silicon nitride ($SiN_x$), silicon nitride oxide ($SiN_xO_y$), titanium oxide ($TiO_x$), and aluminum oxide ($Al_xO_y$).

The adhesive layer 40 is provided substantially uniformly on the protective film 30, and joins the drive substrate 11 on which the display layer 20 is provided to the counter substrate 31. The adhesive layer 40 may be made of, for example, an epoxy resin or an acrylic resin. Further, a sheet-like resin film may also be used to form the adhesive layer 40. Moreover, the adhesive layer 40 may not be necessarily provided; for example, the adhesive layer 40 may be provided only in the peripheral region 110B to allow the display region 110A to have a hollow portion.

The counter substrate 31 seals the organic EL device 10 together with the adhesive layer 40. The counter electrode 31 is made of a material such as glass that is transparent to each of color light beams emitted from the organic EL devices 10R, 10G, and 10B. On the surface of the counter substrate 31 on the drive substrate 11 side, unillustrated color filters configured of, for example, a red filter, a green filter, and a blue filter are provided, respectively, at positions corresponding to the organic EL devices 10R, 10G, and 10B, for example. An unillustrated black matrix is provided among the respective organic EL devices 10R, 10G, and 10B.

(1-2. Manufacturing Method)

The display unit 1 may be manufactured, for example, in accordance with the flowchart illustrated in FIG. 5.

The semiconductor section 20A is formed on the drive substrate 11 (Step S101). First, metal films to be the source electrode 21A and the drain electrode 21B are formed on the entire surface of the drive substrate 11 using the sputtering method or the vacuum vapor deposition method, for example. Next, the metal films are patterned using photolithography and etching, for example, to thereby form the source electrode 21A and the drain electrode 21B. Thereafter, the channel layer 22 and the gate insulating film 23 are formed in order between the source electrode 21A and the drain electrode 21B. More specifically, an organic semiconductor material, for example, a peri-Xanthenoxanthene (PXX) compound solution is applied. Thereafter, the applied organic semiconductor material is heated to form the channel layer 22, following which a spin coating method is used to apply the above-mentioned gate insulating film material, for example, a polyvinylpyrrolidone (PVP) solution is applied and dried. This allows the gate insulating layer 23 to be formed.

Next, the flattening insulating film 25 is formed on the respective wiring lines (source electrode 21A and drain electrode 21B, channel layer 22, or gate electrode 24) and the drive substrate 11. More specifically, for example, a photosensitive resin such as polyimide is applied, and a flattened layer 28 is patterned into a predetermined shape by means of exposure and development. In addition, the connection hole 25A is formed and calcined.

Next, the display section 20B is formed (Step S102). First, the pixel electrode 26 is formed on the flattening insulating film 25. More specifically, a metal film made of, for example, aluminum (Al)/indium-tin oxide (ITO) is formed on the flattening insulating film 25 by the sputtering method, for example. Thereafter, a metal film at a predetermined position is selectively removed by wet etching, for example, to form the pixel electrodes 26 separated for the respective organic EL devices 10R, 10G, and 10B. Thereafter, the partition wall 27 is formed between the respective pixel electrodes 26, following which the organic layer 28 including the light-emitting layer 28B is formed using a deposition method, for example. The counter electrode 29 is formed on the organic layer 28 using the sputtering method, for example. Next, the protective film 30 made of the above-mentioned material is formed on the counter electrode 29 using a plasma chemical vapor deposition (plasma CVD) method, a physical vapor deposition (PVD) method, and an atomic layer deposition (ALD) method, and the deposition method, for example.

Next, the drive substrate 11 and the counter substrate 31 are joined together (Step S103). First, the color filters and the black matrix are formed on the counter substrate 31 made of the above-mentioned material through, for example, application by means of the spin coating method and subsequent patterning using the photolithography method. Thereafter, the adhesive layer 40 made of the above-mentioned material is formed on the counter substrate 31, following which the counter substrate 31 is joined to the drive substrate 11 with the adhesive layer 40 being interposed therebetween to complete the display panel P.

Thereafter, division of the display panel P is performed (Step S104). In order to achieve a display unit having as narrow a bezel region (peripheral region 110B) as possible as in the display unit 1 according to the disclosure, it is necessary to precisely divide the drive substrate 11, display layer 20, and the counter substrate 31, with the adhesive layer 40 being included therein.

Scribing division using a mechanical wheel is typically applied to division of a brittle material. The scribing division involves, for example, forming a crevice on the surface of a glass substrate and extending the crevice. However, it is difficult to control a direction in which the crevice is extended; it is not possible to secure precision in the division due to, for example, extension of a crevice in a diagonal direction during the division. Therefore, it is necessary for the peripheral region 110B to have a certain room as a margin for the division, which prevents a bezel to be narrow.

In contrast, in the present embodiment, for example, a division method using dicing (FIGS. 6A and 6B), or a grinding treatment after the scribing division (FIG. 8C) is performed to achieve a narrow bezel. Use of any of these methods makes it possible to precisely divide the display panel P, as in the display unit 1, having a very short distance from a position of the division to the display region 110A in which the light-emitting device 10 is provided, without occurrence of, for example, any burr, chip, or crack on the end surface of the display panel P, in particular, on the end surfaces of the drive substrate 11 and the counter substrate 31.

The dicing is a method that involves rotating a solid abrasive grain (blade B) at high speed as illustrated in FIG. 6A to divide a substrate (display panel P in this example) as illustrated in FIG. 6B. Use of the dicing for the division of the display panel P makes it possible to limit a surface roughness of a division surface, i.e., a surface roughness of the end surface to 1 μm or smaller.

In the division using the dicing, cooing water is typically used to cool equipment, to remove chip powder generated by the division, and to prevent abrasion of the abrasive grain. FIG. 7 illustrates results of measurement, by calcium corrosion test, of the influence of water used during the dicing division. First, a polyimide material was applied onto a glass substrate by the spin coating method such that the polyimide material had a thickness of about 1 μm, following which a calcium (Ca) film was formed by deposition at a center portion of the applied polyimide material. Silicon nitride (SiN) was formed as a barrier film on the Ca film by the chemical vapor deposition (CVD) method. Thereafter, a UV-cured epoxy resin was applied to a counter glass substrate, which was joined to the glass substrate to prepare Sample 4. In Sample 4, when moisture was permeated to reach the Ca film, the Ca film was corroded, and was converted to calcium hydroxide to be changed into transparent. Further, the SiN film formed on the upper surface of the Ca film served to protect the upper surface of the Ca film; the corrosion due to the entering of moisture was limited only to corrosion from the end surface of Sample 4 formed by joining the glass substrates together.

Four sides near the Ca film of Sample 4 was divided by dicing processing using cooling water, following which baking was performed for 1 hour in vacuum. Subsequently, Sample 4 was stored in a dry atmosphere at a dew point of −75° C. together with Sample 5 not having been subjected to the dicing processing as a comparative example, and thereafter stored in a thermostat bath of a temperature of 60° C. and a humidity of 90% to compare the corrosion states of Ca.

As appreciated from FIG. 7, Sample 4 having been subjected to the dicing processing had less Ca corrosion than unprocessed Sample 5. It was appreciated from this result that exposure of the display panel P, having been subjected to the dicing processing, to cooling water is no problem as long as a material having a sealing property is used as the adhesive layer 40 and as long as the exposure is performed for a short period of time by performing a vacuum baking treatment after the division.

Moreover, the scribing and the grinding treatment thereafter are described. As described above, it is difficult to control an extending direction of the crevice formed by the scribing on the surface of the glass substrate. In particular, in a structure having a resin layer (adhesive layer 40) between two glass substrates (drive substrate 11 and counter substrate 31) as in the display panel P, it is very difficult to sufficiently extend a crevice formed on the surface of the substrate in a thickness direction.

Therefore, in the present embodiment, for example, the adhesive layer 40 near a portion to be divided is removed by laser processing (UV laser L) before forming a crevice in the counter substrate 31 as illustrated in FIG. 8A. Thereafter, a scribing blade C is used to form a crevice on the surface of the display panel P, and the crevice is extended to divide the display panel P as illustrated in FIG. 8B. Thereafter, the divided surface is cut in an arrow direction by mechanical processing as illustrated in FIG. 8C. More specifically, a sheet with a solid abrasive grain adhered thereto (abrasive sheet S) is pressed against the divided surface, and is moved in an oscillating manner in the arrow direction, for example, to grind the divided surface, thus enabling the surface roughness of the end surface to be limited to 1 µm or smaller.

Next, the sealing section 50 is formed on the end surface of the display panel P (Step S105). First, a description is given of a case of forming an aluminum oxide ($Al_2O_3$) film as the inorganic film 51A using the atomic layer deposition (ALD) method. The inorganic film 51A is formed by the ALD method using, for example, trimethyl aluminum (TMA; $(CH_3)_3Al$) as a first precursor gas, and, for example, water ($H_2O$) as a second precursor gas, with a nitrogen gas or an argon gas being used as a purge gas. The temperature for the film formation may be desirably 120° C. or lower, and more desirably 100° C. or lower.

Subsequently, the organic film 52A is formed using, for example, the UV-cured epoxy resin by means of an offset application method, for example. In this case, the viscosity of the organic agent before curing may be preferably 50 mPa·s or lower, for example. Specific film-forming method involves using a stainless steel jig having a transfer section size of 0.1 mm width as an offset jig, for example. A method for attaching the organic agent involves the following procedures. For example, a transfer surface of the offset jig is immersed in the organic agent, that is leveled to have a set thickness (e.g., 10 µm to 30 µm) using an applicator, in a parallel manner, and the immersed transfer surface of the offset jig is pulled up in a parallel manner. Thereafter, the reference plane of a panel-fixing jig and the reference plane of the offset jig are made closer in a parallel manner, and pressed against each other to transfer the organic agent to a panel application surface. At this time, in order to spread the organic agent, a time period of three seconds, for example, may be necessary to hold this state, following which the reference plane of the panel-fixing jig and the reference plane of the offset jig are released from each other in a parallel manner. In this case, in order to eliminate the influence of damage, due to a contact, to the inorganic layer that covers an exposed surface of the cross-sectional structure of the panel, it is preferable to use an offset component having a larger width than that of the exposed surface and to bring the offset component into contact with the application surface at an angle of 5°, for example.

Examples other than the above-described offset method may include the dispensing method. Application conditions may involve, for example, using a nozzle having an external diameter of 0.23 mm and an internal diameter of 0.1 mm, and performing application such that: the distance from a nozzle tip to the application surface is 30 µm; the nozzle movement speed is 50 mm/sec.; and the application pressure is 0.015 MPa.

Using the above-described method, the organic agent is applied, for example, to the four sides of the display panel P and, as necessary, to four corners, following which the organic agent is cured. The curing method involves ultraviolet (UV) irradiation at a light integral of about 700 mJ/cm$^2$ or higher, for example. The curing method may be preferably selected appropriately depending on materials; heat and UV irradiation may be used together. Further, the UV irradiation may also be performed, for example, in an inert gas such as the atmosphere, nitrogen, and argon.

Next, a second layered inorganic film (inorganic film 51B) is formed using a method similar to that for the inorganic film 51A, and thereafter a second layered organic film (organic film 52B) is formed. In this example, the dip method, for example, may be used for film formation. First, the application surface of the display panel P is made closer in the longitudinal direction to the organic agent in a bath in a parallel manner to be brought into contact therewith. As for the thickness in the Y-axis direction of the display panel P, the application surface is brought into contact with a curved tip, which is formed by utilization of surface tension, of the organic agent, thereby preventing the organic agent from running off to a surface other than the panel application surface. The panel application surface is brought into contact with the organic agent in this manner, and thereafter is pulled up, for example, at a constant speed of about 5 mm/sec. in a parallel manner to thereby form the organic film 52B. This process is performed for the four side of the display panel P, following which the UV irradiation is used for curing.

It is to be noted that the dispensing method may also be used as the film-forming method for the organic film 52B. Application conditions may involve, for example, using a nozzle having an external diameter of 0.23 mm and an internal diameter of 0.1 mm, and performing application such that: the distance from a nozzle tip to the application surface is 100 µm; the nozzle movement speed is 25 mm/sec.; and the application pressure is 0.015 MPa.

Subsequently, methods similar to those for the inorganic film 51B and the organic film 52B are used, respectively, for formation of a third layered inorganic film 51C and a third layered organic film 52C. This allows the sealing section 50 to be formed. Through the above-described procedures, the display unit 1 illustrated in FIG. 1 is completed.

(1-3. Function and Effect)

In the display unit 1, a scanning signal is supplied from the scanning line drive circuit 130 to each pixel 5 through the gate electrode of the write transistor Tr2, and an image signal is supplied from the signal line drive circuit 120 through the write transistor Tr2 to a holding capacitor Cs and is stored therein. In other words, the drive transistor Tr1 is on/off controlled depending on the signal stored in the holding capacitor Cs. This causes a drive current Id to be injected into the organic EL device 10, and thus holes and electrons are recombined to generate light emission. The light is transmitted through the counter electrode 29, the protective film 30, the adhesive layer 40, unillustrated color filters of respective colors, and the counter substrate 31 to be extracted, because the display unit 1 is a top surface emission (top emission) display unit in this example. In a manner as described above, the display unit 1 performs image display (color image display).

Incidentally, an organic EL display unit used, for example, as an organic EL television is requested to enlarge an effective display region as a measure to seek a design property as described above, and thus is requested to reduce a bezel portion. However, simply narrowing the bezel region causes entering of moisture from the outside, thus deteriorating organic layers configuring the light-emitting device. This causes a non-emission region referred to as "dark spot" to be formed, which impairs the reliability of the organic EL display unit.

In order to solve this issue, it is necessary, for example, to allow an organic insulating film such as a flat film provided around the emission region and a so-called sealing layer that performs surface-sealing of a gap between substrates to have a certain degree of width. Further, an organic insulating film formed to have a relatively large size for suppressing entering of, for example, moisture from the outside causes moisture remaining in the film to be increased accordingly. Thus, it is contemplated that formation of a separating groove that separates the organic insulating film into an inner peripheral portion and an outer peripheral portion suppresses entering of moisture contained in the organic insulating film.

However, it is difficult for the above-described method to reduce the bezel region sifnificantly, although the method is able to prevent or suppress the entering of moisture into the organic layer.

In contrast, unlike the example of providing a structure that suppresses the entering of moisture into the peripheral region 110B on the periphery of the display region 110A, the display unit 1 of the present embodiment is configured to provide the sealing structure 50 on the end surface of the display panel formed by joining the drive substrate 11 and the counter substrate 31 together, with the display layer 20 including the organic EL device 10 being interposed therebetween. In particular, by configuring the sealing structure 50 as layered films of the inorganic film 51 made of an inorganic material and the organic film 52 made of an organic material, it becomes possible to minimize the sealing structure that suppresses the entering of moisture into the display layer 20. This enables the bezel region to be 0.1 mm or smaller, for example.

In the present embodiment, the sealing section 50 is provided on the end surface of the display layer 20 including the organic layer 28 provided between the drive substrate 11 and the drive substrate 11 as described above. The sealing section 50 is so provided as to overlap at least a portion of the end surfaces of the drive substrate 11 and the drive substrate 11. This makes it possible to prevent the entering of moisture into the organic layer 28 while reducing the peripheral region 110B provided on the periphery of the display region 110A as much as possible. Thus, it becomes possible to provide the display unit 1 that has a narrow bezel region while keeping reliability, and an electronic apparatus including the display unit 1.

[2. Modification Example]

Now, modification examples (Modification Examples 1 to 3) of the foregoing embodiment are described. It is to be noted that the same reference numeral is assigned to the same component in the foregoing embodiment, and description therefor is omitted where appropriate.

(Modification Example 1)

FIG. 9 schematically illustrates a planar configuration of an organic EL display unit (a display unit 2) according to Modification Example 1 of the foregoing embodiment. FIG. 10 illustrates a cross-sectional configuration taken along line I-I in FIG. 9. Unlike the display unit 1 in which the sealing section 50 is provided continuously across the entire end surface of the display panel P, the organic EL display unit 2 is provided with, for example, a wiring line terminal (a terminal section 150), that drives the organic EL device 10 from the outside, at one side of the peripheral region 110B.

The terminal section 150 is provided with, for example, a wiring line layer 61 that is formed as the same wiring line layer as the above-described source electrode 21A and drain electrode 21B. The flattening insulating film 25 is formed on the wiring line layer 61 in the manufacturing process; however, the flattening insulating film 25 on the wiring line layer 61 is removed for electrical coupling to the outside, and thus the wiring line layer 61 is in a state of being exposed. The removal process is performed, for example, after the formation of the sealing section 50 in the foregoing embodiment, and thus the sealing section 50 at one side, at which the terminal section 150 is provided, of the display panel P results in being removed. Therefore, in the present modification example, a separation groove A that completely separates the flattening insulating film 25 is provided between the display region 110A and the terminal section 150 as illustrated in FIG. 10. The provision of the separation groove A forms a new end surface configured by the display layer 50 and the counter substrate 31, and a sealing section 50A similar to the sealing section 50 in the foregoing display unit 1 is formed on the new end surface.

Further, as illustrated in FIG. 11, on the new end surface configured by the display layer 50 and the counter substrate 31, the inorganic film 51 in direct contact with the end surface is provided continuously from the end surface onto the drive substrate 11 inside the separation groove A. A sealing section 50B may be provided which includes the organic films 52 and other inorganic films 51 being alternately layered outside the inorganic film 51. One end surface of each of the organic films 52 and other inorganic films 51 is in contact with the inorganic film 51 on the drive substrate 11. It is to be noted that FIG. 11 illustrates an example in which the separation groove A is completely filled with the sealing section 50B; however, there may be a gap between the sealing section 50B and the flattening insulating film 25A that configures the separation groove A.

This makes it possible to reduce the bezel region as much as possible while preventing the entering of moisture into the organic layer 28, also in the display unit 2 including, at one side of the peripheral region 110B, the terminal section 150 that drives the organic EL device 10 from the outside. In particular, the provision of the sealing section 50B having the structure illustrated in FIG. 11 makes it possible to suppress the entering of moisture through a gap between the drive substrate 11 and the flattening insulating film 25 and thus to further prevent the entering of moisture into the organic layer 28.

(Modification Example 2)

FIG. 12 illustrates a cross-sectional configuration of an organic EL display unit (a display unit 3) according to Modification Example 2 of the foregoing embodiment. The display unit 3 has a configuration in which the wiring line of the transistor 20X and the cathode electrode of the organic EL device 10 are taken out toward a rear surface of the drive substrate 11. This configuration may be used, for example, as a method of taking out a wiring line of a display panel circumferentially surrounded by another display panel when manufacturing an ultra-large-sized display panel by combining a plurality of display panels as described above.

As for a specific method of taking out each wiring line, for example, when a wiring line of the transistor 20X is taken out toward the rear surface of the drive substrate 11, a through-silicon via (TSV) that passes through the drive substrate 11 may be provided to take out the wiring line toward the rear surface to electrically couple the wiring line to an external drive circuit. In contrast, when taking out a cathode electrode toward the rear surface of the drive substrate 11, an electrically conductive film may be formed between the end surface of the display panel P and a sealing section 70 provided on the end surface thereof. Alternatively, as illustrated in FIG. 12, an inorganic film 71A that configures the sealing section 70 may be made of an inorganic material having electrical conductivity (e.g., an atomic layer deposition (ALD) film of zinc oxide (ZnO) and aluminum (Al)). In this case, by extending the inorganic film 71A from the end surface to the rear surface of the drive substrate 11, it becomes possible to take out the cathode electrode toward the rear surface through the end surface of the display panel.

It is to be noted that the film formation of the ZnO-based electrically conductive film by the atomic layer deposition (ALD) method may be performed, for example, at a low temperature around 100° C. using zinc diethyl $((C_2H_3)_2Zn)$ and water. The specific resistance for a ZnO monolayer prepared at 110° C. is $2\times10-2\Omega$. cm. In order to lower the specific resistance, Al is doped into ZnO (i.e, ZnO:Al (AZO)). When the doping of Al is performed by the ALD method, trimethyl aluminum (TMA) and water are used in a manner similar to the $Al_2O_3$ film. For example, when 20 ZnO layers are stacked as 20 atomic layers by means of the ALD method, and one $Al_2O_3$ layer is interlayered to prepare ZnO (20 layers)/$Al_2O_3$ (1 layer), there is a possibility that the specific resistance may be on the order of $10^{-3}\Omega$.

(Modification Example 3)

FIG. 13 illustrates a portion of steps for manufacturing a display unit 1 according to Modification Example 3 of the foregoing Example. In the present modification example, an description is given of a dividing method in which a plurality of organic EL devices (display layer 20) that serve as the display panel P are formed on and joined to a large-sized substrate referred to as a so-called "mother glass", and thereafter the substrate with the organic EL devices being joined thereto is divided into display panels P having a predetermined size.

As described above, cutting processing after dicing and scribing may be one of the methods of forming the plurality of organic EL devices on the large-sized substrate and thereafter dividing it into the display panels P having the predetermined size as described above. However, the cutting processing is slower than a typical scribing division in the processing speed; for example, the speed of the cutting process is a tenth (1/10) of the speed of scribing processing, although it depends on the amount of processing, and thus the production efficiency is lowered.

Therefore, in the present modification example, the dividing step is performed by separating it into two stages. First, as illustrated in FIG. 13A, scribing division is performed as a first cut, in which division speed is fast while division precision is low. More specifically, for example, a large-sized glass substrate PL is divided into a plurality of display panels PP by scribing along a cut line 1 using a laser, after removal of the adhesive layer 40 as illustrated in FIG. 8A. The cut line 1 is configured to allow for scribing division such that the display panel PP is larger than a predetermined outer shape of the organic EL display unit taking into consideration division precision in the scribing division.

Subsequently, as illustrated in FIG. 13B, a second cut is performed which involves dividing the display panel PP having been divided separately to have a predetermined size by means of precision division. As the dividing method in this case, it is preferable to adopt mechanical cutting processing using dicing or the abrasive sheet S with use of the solid abrasive grain.

Performing the two-stage division in this manner makes it possible to enhance the production efficiency. Further, even taking into consideration a processing facility, it is possible to significantly reduce the facility cost.

It is to be noted that, when a plurality of display panels P are prepared at once as in the present modification example, forming the above-described sealing section 50 as described below makes it possible to further enhance the production efficiency of the display unit 1.

The inorganic film 51 configuring the sealing section 50 is effectively formed by the ALD method from the viewpoints of film thickness and a film property as described above. However, the ALD method is slow in the film-forming speed; a time period of 10 hours or more may be sometimes necessary to form a film having a thickness of 25 nm, for example. Therefore, in the present modification example, it is preferable to join a plurality of display panels P together and to form an inorganic film at once on the surface thereof. More specifically, the large-sized glass substrate PL illustrated in (A) of FIG. 14 is divided separately as illustrated in (B) of FIG. 14 by the above-described two-stage division, and the divided display panels PP are further subjected to the precision division to provide the display panels P having a predetermined size. The display panels P are overlapped on top of each other as illustrated in (C) of FIG. 14, and the inorganic film is formed at once on the surfaces thereof. This makes it possible to significantly increase the film formation speed per display panel.

[3. Application Example]

Application examples of the organic EL display units (display units 1 to 3) described in the foregoing embodiment and Modification Examples 1 to 3 are described below. The display units 1 to 3 of the foregoing embodiment are applicable to display units of electronic apparatuses in any fields that display, as an image or a picture, an image signal input from outside or an image signal produced inside, such as televisions, digital cameras, notebook personal computers, portable terminal devices such as mobile phones, and video cameras. The display units 1 to 3 described herein are particularly suitable for small-sized to mid-sized displays for mobile applications. The followings show examples thereof (Application Example 1)

FIG. 15 illustrates an outer appearance of a television according to Application Example 2. The television may include, for example, an image display screen section 200 that includes a front panel 210 and a filter glass 220. The image display screen section 200 corresponds to any of the display units 1 to 3 according to the foregoing embodiment and Modification Examples 1 to 3.

(Application Example 2)

FIG. 16 illustrates an outer appearance of a notebook personal computer to which the display unit 1A of the foregoing embodiment is applicable. The notebook personal computer may include, for example, a main body 410, a keyboard 420 for operation of inputting characters, for example, and a display section 430 as any of the above-described display units 1 to 3.

(Application Example 3)

FIGS. 17A and 17B illustrate an outer appearance of a tablet personal computer 640 according to Application Example 3. The tablet personal computer 640 may include, for example, a casing 620 on which a touch panel section 610 and an operation section 630 are disposed. Any of the above-described display units 1 to 3 of the foregoing embodiment and Modification Examples 1 to 3 is mounted in the touch panel section 610.

Although description has been given of the present disclosure, referring to the embodiment, Modification Examples 1 to 3, and the application examples, the disclosure is by no means limited to the foregoing embodiment, Modification Examples 1 to 3, and the application examples, and various modifications are possible.

For example, the material and thickness of each layer, the method and conditions of forming each layer are not limited to those described in the foregoing embodiment, Modification Examples 1 to 3, and Application Examples 1 to 3; each layer may be made of any other material with any other thickness by any other method under any other conditions. For example, the display units 1 to 3 described in the above-described embodiment, modification examples 1 to 3, and application examples may use a resin substrate such as a plastic as a substrate on which the organic EL device 10 is provided, thus achieving a bendable display unit by taking advantage of flexibility of an organic substance.

Further, the description has been given of the case where the organic EL display unit is the top surface emission (top emission) display unit in the foregoing embodiment, Modification Examples 1 to 3, and Application Examples 1 to 3; however, this is not limitative. The organic EL display unit may also be configured to be a bottom surface emission (bottom emission) display unit. In the case of such a bottom surface emission organic EL display unit, the pixel electrode 26 may be made of any of ITO, IZO, and ZnO, for example. The counter electrode 29 may be made of Al or MgAg, or the layered structure of ITO/Ag/ITO. The bottom surface emission organic EL display unit may be formed with a layering order in which the organic layers 28 are layered reversely to the foregoing embodiment.

Furthermore, the description has been given with reference specifically to the configuration of the organic EL display device 10 in the foregoing embodiment, Modification Examples 1 to 3, and Application Examples 1 to 3; however, all the layers are not necessarily provided, and another layer may also be provided. For example, a resistive layer made of a material having a resistivity of, for example, 1 to $10^7$ Ωcm may be provided on the electron supply layer 28C. Examples of the specific material of a resistive layer 163 may include niobium oxide ($NbO_x$), titanium oxide ($TiO_x$), molybdenum oxide ($MoO_x$), and tantalum oxide ($TaO_x$), and a mixture of niobium oxide ($NbO_x$) and titanium oxide ($TiO_x$), a mixture of titanium oxide ($TiO_x$) and zinc oxide ($ZnO_x$), and a mixture of silicon oxide ($SiO_x$) and tin oxide ($SnO_x$). The provision of the resistive layer makes it possible to suppress the generation of a dark spot in the organic EL display unit in addition to the effects described in the foregoing embodiment.

In addition, description has been given of the case of the active matrix display unit in the foregoing embodiment, Modification Examples 1 to 3, and Application Examples 1 to 3; however, the present disclosure may also be applicable to a passive matrix display unit. Furthermore, the configuration of the pixel drive circuit that performs an active matrix drive is not limited to those described in the foregoing embodiment; a capacitor or a transistor may also be added as necessary. In this case, a necessary drive circuit may also be added, in addition to the above-described signal line drive circuit 120 and the scanning line drive circuit 130, depending on alteration of the pixel drive circuit.

Description has been given of three types of pixels of the red pixel 5R, the green pixel 5G, and the blue pixel 5B as color pixels in the foregoing embodiment, Modification Examples 1 to 3, and Application Examples 1 to 3. However, this is not limitative; for example, a color pixel such as a white pixel 5W and a yellow pixel 5Y may also be combined.

It is to be noted that the effects described herein are mere examples. The effect of the technology is not limited thereto, and may include other effects.

It is to be noted that the technology may also have the following configurations.

(1)
An organic EL display unit including:
a first substrate;
a second substrate;
a display layer provided between the first substrate and the second substrate, the display layer including an organic layer; and
a sealing section provided continuously from an end surface of the display layer to at least a portion of respective end surfaces of the first substrate and the second substrate.

(2)
The organic EL display unit according to (1), wherein the sealing section has a layered structure in which an inorganic material layer and an organic material layer are stacked in this order.

(3)
The organic EL display unit according to (1) or (2), wherein the sealing section has a multi-layered structure in which an inorganic material layer and an organic material layer are stacked alternately.

(4)
The organic EL display unit according to (3), wherein
the organic material layer includes a plurality of organic material layers, and
the organic material layers that configure the multi-layered structure have a width in a direction in which the first substrate, the second substrate, and the display layer are stacked, the width of the organic material layers becoming larger in an order of the stack of the organic material layers.

(5)
The organic EL display unit according to any one of (2) to (4), wherein the inorganic material layer contains one or more of aluminum oxide (Al2O3), silicon oxide (SiO2), zirconium oxide (ZrO2), titanium oxide (TiO2), zinc oxide (ZnO2), indium-zinc oxide (IZO), indium-tin oxide (ITO), indium-gallium-zinc oxide (IGZO), aluminum-zinc oxide (AZO), gallium-zinc oxide (GZO), silicon nitride (SiN), and silicon oxynitride (SiON).

(6)
The organic EL display unit according to any one of (2) to (4), wherein the inorganic material layer contains one or more of ruthenium (R), platinum (Pt), iridium (Ir), palladium (Pd), rhodium (Rh), gold (Au), silver (Ag), copper (Cu), nickel (Ni), cobalt (Co), iron (Fe), manganese (Mn), tantalum (Ta), tungsten (W), molybdenum (Mo), titanium (Ti), aluminum (Al), silicon (Si), germanium (Ge), and zinc (Zn), or an alloy thereof.

(7)
The organic EL display unit according to any one of (1) to (6), further including a flattening film containing an organic material and provided on the end surface of the display layer.

(8)
The organic EL display unit according to any one of (2) to (7), wherein the inorganic material layer firstly provided on the end surface of the display layer has electrical conductivity.

(9)
A method of manufacturing an organic EL display unit, the method including:
forming, on a first substrate, a display layer including an organic layer;
joining the first substrate and the second substrate together, with the display layer being provided therebetween; and
forming a sealing section continuously from an end surface of the display layer to at least a portion of respective end surfaces of the first substrate and the second substrate.

(10)
The method of manufacturing the organic EL display unit according to (9), further including providing an adhesive layer on the second substrate before the joining, with the display layer being provided therebetween, of the first substrate and the second substrate together.

(11)
The method of manufacturing the organic EL display unit according to (9) or (10), further including dividing, including the display layer, the first substrate and the second substrate after the joining, with the display layer being provided therebetween, of the first substrate and the second substrate together.

(12) The method of manufacturing the organic EL display unit according to (11), wherein the dividing is performed by dicing.

(13) The method of manufacturing the organic EL display unit according to (11), wherein the dividing is performed by scribing after removal, with a laser, of the adhesive layer provided between the display layer and the second substrate.

(14) An electronic apparatus with an organic EL display unit, the organic EL display unit including:
a first substrate;
a second substrate;
a display layer provided between the first substrate and the second substrate, the display layer including an organic layer; and
a sealing section provided continuously from an end surface of the display layer to at least a portion of respective end surfaces of the first substrate and the second substrate.

This application is based upon and claims the benefit of priority of the Japanese Patent Application No. 2014-201517 filed with the Japan Patent Office on Sep. 30, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An organic EL display unit comprising:
    a first substrate;
    a second substrate;
    a display layer located between the first substrate and the second substrate, the display layer including an organic layer; and
    a sealing section extending continuously along an end surface of the display layer to at least a portion of respective end surfaces of the first substrate and the second substrate,
    wherein
    the sealing section has a layered structure including an inorganic material layer and an organic material layer,
    the organic material layer includes first and second outermost edges positioned along a plane parallel to the end surface, and
    the first and second outermost edges of the organic material layer are entirely covered by the inorganic material layer.

2. The organic EL display unit according to claim 1, wherein the inorganic material layer is one of a plurality of inorganic material layers, the organic material layer is one of a plurality of organic material layers, and the layered structure of the sealing section has the inorganic material layers and the organic material layers stacked alternately.

3. The organic EL display unit according to claim 2, wherein
    the width of respective instances of the organic material layers becomes larger in an order of a stacking of the organic material layers.

4. The organic EL display unit according to claim 1, wherein the inorganic material layer contains one or more of aluminum oxide (Al2O3), silicon oxide (SiO2), zirconium oxide (ZrO2), titanium oxide (TiO2), zinc oxide (ZnO2), indium-zinc oxide (IZO), indium-tin oxide (ITO), indium-gallium-zinc oxide (IGZO), aluminum-zinc oxide (AZO), gallium-zinc oxide (GZO), silicon nitride (SiN), and silicon oxynitride (SiON).

5. The organic EL display unit according to claim 1, wherein the inorganic material layer contains one or more of ruthenium (R), platinum (Pt), iridium (Ir), palladium (Pd), rhodium (Rh), gold (Au), silver (Ag), copper (Cu), nickel (Ni), cobalt (Co), iron (Fe), manganese (Mn), tantalum (Ta), tungsten (W), molybdenum (Mo), titanium (Ti), aluminum (Al), silicon (Si), germanium (Ge), and zinc (Zn), or an alloy thereof.

6. The organic EL display unit according to claim 1, further comprising a flattening film containing an organic material and provided on the end surface of the display layer.

7. The organic EL display unit according to claim 1, wherein the inorganic material layer firstly provided on the end surface of the display layer has electrical conductivity.

8. A method of manufacturing an organic EL display unit, the method comprising:
    forming, on a first substrate, a display layer including an organic layer;
    joining the first substrate and the second substrate together, with the display layer being provided therebetween; and
    forming a sealing section that extends continuously along an end surface of the display layer to at least a portion of respective end surfaces of the first substrate and the second substrate,
    wherein
    the sealing section has a layered structure including an inorganic material layer and an organic material layer,
    the organic material layer includes first and second outermost edges positioned along a plane parallel to the end surface, and
    the first and second outermost edges of the organic material layer are entirely covered by the inorganic material layer.

9. The method of manufacturing the organic EL display unit according to claim 8, further comprising providing an adhesive layer on the second substrate before the joining, with the display layer being provided therebetween, of the first substrate and the second substrate together.

10. The method of manufacturing the organic EL display unit according to claim 8, further comprising dividing, including the display layer, the first substrate and the second substrate after the joining, with the display layer being provided therebetween, of the first substrate and the second substrate together.

11. The method of manufacturing the organic EL display unit according to claim 10, wherein the dividing is performed by dicing.

12. The method of manufacturing the organic EL display unit according to claim 10, wherein the dividing is performed by scribing after removal, with a laser, of the adhesive layer provided between the display layer and the second substrate.

13. An electronic apparatus with an organic EL display unit, the organic EL display unit comprising:
    a first substrate;
    a second substrate;
    a display layer located between the first substrate and the second substrate, the display layer including an organic layer; and a sealing section that extends continuously along an end surface of the display layer to at least a portion of respective end surfaces of the first substrate and the second substrate, wherein the sealing section has a layered structure including an inorganic material layer and an organic material layer, the organic material layer includes first and second outermost edges positioned along a plane parallel to the end surface, and the first and second outermost edges of the organic material layer are entirely covered by the inorganic material layer.

14. The electronic apparatus according to claim 13, wherein the inorganic material layer is one of a plurality of inorganic material layers, the organic material layer is one of a plurality of organic material layers, and the layered structure of the sealing section has the inorganic material layers and the organic material layers stacked alternately.

15. The electronic apparatus according to claim 14, wherein the width of respective instances of the organic material layers becomes larger in an order of a stacking of the organic material layers.

16. The electronic apparatus according to claim 13, wherein the inorganic material layer contains one or more of aluminum oxide (Al2O3), silicon oxide (SiO2), zirconium oxide (ZrO2), titanium oxide (TiO2), zinc oxide (ZnO2), indium-zinc oxide (IZO), indium-tin oxide (ITO), indium-gallium-zinc oxide (IGZO), aluminum-zinc oxide (AZO), gallium-zinc oxide (GZO), silicon nitride (SiN), and silicon oxynitride (SiON).

17. The electronic apparatus according to claim 13, wherein the inorganic material layer contains one or more of ruthenium (R), platinum (Pt), iridium (Ir), palladium (Pd), rhodium (Rh), gold (Au), silver (Ag), copper (Cu), nickel (Ni), cobalt (Co), iron (Fe), manganese (Mn), tantalum (Ta), tungsten (W), molybdenum (Mo), titanium (Ti), aluminum (Al), silicon (Si), germanium (Ge), and zinc (Zn), or an alloy thereof.

18. The electronic apparatus according to claim 13, further comprising a flattening film containing an organic material and provided on the end surface of the display layer.

19. The electronic apparatus according to claim 13, wherein the inorganic material layer firstly provided on the end surface of the display layer has electrical conductivity.

* * * * *